United States Patent
Yoneda et al.

(10) Patent No.: US 8,174,033 B2
(45) Date of Patent: May 8, 2012

(54) LIGHT EMISSION DEVICE INCLUDING SEMICONDUCTOR LIGHT EMITTING ELEMENTS

(75) Inventors: Akinori Yoneda, Anan (JP); Akiyoshi Kinouchi, Komatsushima (JP); Hirofumi Kawaguchi, Tokushima (JP)

(73) Assignee: Nichia Corporation, Tokushima (JP)

( * ) Notice: Subject to any disclaimer, the term of this patent is extended or adjusted under 35 U.S.C. 154(b) by 230 days.

(21) Appl. No.: 12/105,058

(22) Filed: Apr. 17, 2008

(65) Prior Publication Data

US 2008/0258158 A1    Oct. 23, 2008

(30) Foreign Application Priority Data

Apr. 18, 2007 (JP) ................................. 2007-108827
Feb. 6, 2008 (JP) ................................... 2008-26481

(51) Int. Cl.
*H01L 33/00* (2010.01)
(52) U.S. Cl. ............... 257/88; 257/89; 257/90; 257/91; 257/93; 257/E33.062; 362/539; 362/543; 362/544; 362/545
(58) Field of Classification Search ............. 257/88–93, 257/E33.062; 362/539, 543–545
See application file for complete search history.

(56) References Cited

U.S. PATENT DOCUMENTS

| 7,193,358 B2 | 3/2007 | Yamada et al. | |
|---|---|---|---|
| 2001/0032985 A1 | 10/2001 | Bhat et al. | |
| 2004/0084684 A1* | 5/2004 | Tarsa et al. | 257/91 |
| 2006/0157724 A1* | 7/2006 | Fujita | 257/99 |
| 2006/0261364 A1 | 11/2006 | Suehiro et al. | |
| 2007/0085944 A1* | 4/2007 | Tanaka et al. | 349/69 |

FOREIGN PATENT DOCUMENTS

| JP | 10-321915 | | 12/1998 |
|---|---|---|---|
| JP | 2002-270905 | | 9/2002 |
| JP | 2005-85548 | | 3/2005 |
| JP | 2005-109434 | | 4/2005 |
| JP | 2005109434 A | * | 4/2005 |
| JP | 2006019347 A | * | 1/2006 |
| JP | 2006-66700 | | 3/2006 |
| WO | WO 2004/082036 | | 9/2004 |

* cited by examiner

*Primary Examiner* — N Drew Richards
*Assistant Examiner* — John P Dulka
(74) *Attorney, Agent, or Firm* — Ditthavong Mori & Steiner, P.C.

(57) ABSTRACT

A light emission device includes a plurality of semiconductor light emitting elements and a supporting substrate on which the plurality of semiconductor light emitting elements are flip-chip mounted. Each of the plurality of semiconductor light emitting elements has a substantially rectangular shape which has a first side and a second side different from the first side. Light emitted from a first element end face on the first side is stronger than light emitted from a second element end face on the second side. Each first side of each of the plurality of semiconductor light emitting elements faces each other substantially in parallel.

27 Claims, 23 Drawing Sheets

$A_1 = A_a + A_b$
$A_2 = 0$ $A_2 = A_{8a} + A_{8b}$

LIGHT EMISSION DEVICE INCLUDING SEMICONDUCTOR LIGHT EMITTING ELEMENTS

CROSS-REFERENCE TO RELATED APPLICATIONS

The present application claims priority under 35 U.S.C. §119 to Japanese Patent Application No. 2007-108827, filed Apr. 18, 2007, and Japanese Patent Application No. 2008-26481, filed Feb. 6, 2008. The contents of these applications are incorporated herein by reference in their entirety.

BACKGROUND OF THE INVENTION

1. Field of the Invention

The present invention relates to a light emission device.

2. Discussion of the Background

The semiconductor light emitting element is mounted on a supporting substrate, a package, and the like through various methods. The semiconductor light emitting element having positive and negative electrodes on the same surface side is flip-chip mounted by joining the positive and negative electrode side to the supporting substrate etc., so that light can be retrieved from the substrate side of the element. A method of flip-chip mounting the semiconductor light emitting element includes, for example, a method comprising forming a bump on a conductor wiring arranged on a main surface of a supporting substrate capable of mounting the semiconductor light emitting element, facing the electrode surface of the semiconductor light emitting element having a pair of positive and negative electrodes arranged on the same surface side to the bump, and contacting the positive and negative electrodes of the semiconductor element and the bump to join the conductor wiring and the electrodes of the semiconductor light emitting element. The conductor wiring of the supporting substrate and the positive and negative electrodes of the semiconductor light emitting element are joined through the bump in this manner so that they are electrically conducted.

A plurality of semiconductor light emitting elements can be mounted on one light emission device. For example, WO2004/082036, Japanese Laid-Open Patent Publication Nos. 2005-85548, 2005-109434 and 2006-66700 disclose such a light emission device. The contents of these publications are incorporated herein by reference in their entirety. One example is shown in FIG. 20. The light emission device shown in FIG. 20 has a circuit pattern 52 containing W, Ni, and Au on the surface of $Al_2O_3$ substrate 51 containing glass, and a total of nine GaN-based LED elements 53 arrayed three by three are flip-chip mounted on the circuit pattern 52 through an Au bump. An electrode structure of the GaN-based LED element 53 is omitted, but is arranged in correspondence to the circuit pattern 52.

In the light emission device flip-chip mounted with the light emitting element, most of the light generated in the light emitting element is exited from the surface on the substrate side or the side surface of the element. The light exited from the end face of the element side surface is generally reflected by a reflection plate etc. arranged in the light emission device, and is retrieved to the light emission observing surface side.

However, some of the light exited from the element end face is absorbed by the supporting substrate, the sealing resin, and the like until reflected with a reflection plate. Thus, in the conventional light emission device, the light from the element end face was attenuated before retrieved as light of the light emission device, and thus did not sufficiently contribute to light emission of the entire light emission device.

SUMMARY OF THE INVENTION

According to one aspect of the present invention, a light emission device includes a plurality of semiconductor light emitting elements and a supporting substrate on which the plurality of semiconductor light emitting elements are flip-chip mounted. Each of the plurality of semiconductor light emitting elements has a substantially rectangular shape which has a first side and a second side different from the first side. Light emitted from a first element end face on the first side is stronger than light emitted from a second element end face on the second side. Each of the plurality of semiconductor light emitting elements includes a transparent substrate, a first semiconductor layer of a first conductive type provided on the transparent substrate, a second semiconductor layer of a second conductive type provided on the first semiconductor layer, a first electrode provided on an exposure part of the first semiconductor layer, and a second electrode provided on the second semiconductor layer. Each first side of each of the plurality of semiconductor light emitting elements faces each other substantially in parallel.

According to another aspect of the present invention, a light emission device includes a plurality of semiconductor light emitting elements and a supporting substrate on which the plurality of semiconductor light emitting elements are flip-chip mounted. Each of the plurality of semiconductor light emitting elements each has a substantially rectangular shape which has a first side and a second side different from the first side. Each of the plurality of semiconductor light emitting elements includes a transparent substrate, a first semiconductor layer of a first conductive type provided on the transparent substrate, a second semiconductor layer of a second conductive type provided on the first semiconductor layer, a first electrode provided on an exposure part of the first semiconductor layer, and a second electrode provided on the second semiconductor layer. Each first side of each of the plurality of semiconductor light emitting elements faces each other substantially in parallel. A ratio R1/L1 of R1 to L1 is smaller than a ratio R2/L2 of R2 to L2, wherein R1 is an area of a first region on the second electrode, the first region being defined by a group of first hypothetical lines extending on the second electrode perpendicularly to the first side from the first side to either one of a third side of each of the plurality of semiconductor light emitting elements opposite to the first side or a first exposure side of the exposure part of the first semiconductor layer, which the first hypothetical lines on the second electrode first reach, L1 is a length of the first side, R2 is an area of a second region on the second electrode, the second region being defined by a group of second hypothetical lines extending on the second electrode perpendicularly to the second side from the second side to either one of a fourth side of each of the plurality of semiconductor light emitting elements opposite to the second side or a second exposure side of the exposure part of the first semiconductor layer, which the second hypothetical lines on the second electrode first reach, and L2 is a length of the second side.

According to further aspect of the present invention, a light emission device includes a plurality of semiconductor light emitting elements and a supporting substrate on which the plurality of semiconductor light emitting elements are flip-chip mounted. Each of the plurality of semiconductor light emitting elements each has a substantially rectangular shape which has a first side and a second side different from the first side. Each of the plurality of semiconductor light emitting elements includes a transparent substrate, a first semiconductor layer of a first conductive type provided on the transparent substrate, a second semiconductor layer of a second conductive type provided on the first semiconductor layer, a first electrode provided on an exposure part of the first semiconductor layer, and a second electrode provided on the second semiconductor layer. Each first side of each of the plurality of semiconductor light emitting elements faces each other substantially in parallel. The second electrode of each of the semiconductor light emitting elements includes a first narrow region and a first extending part. The first narrow region is sandwiched by the first side and the exposure part. The first extending part extends towards an inner side of each of the semiconductor light emitting elements from the first narrow region. A length of the first narrow region along the first side is longer than a length of the first extending part along the first side.

BRIEF DESCRIPTION OF THE DRAWINGS

The invention, together with objects and advantages thereof, may best be understood by reference to the following description of the presently preferred embodiment together with the accompanying drawings in which.

DESCRIPTION OF THE EMBODIMENTS

Figure 1:
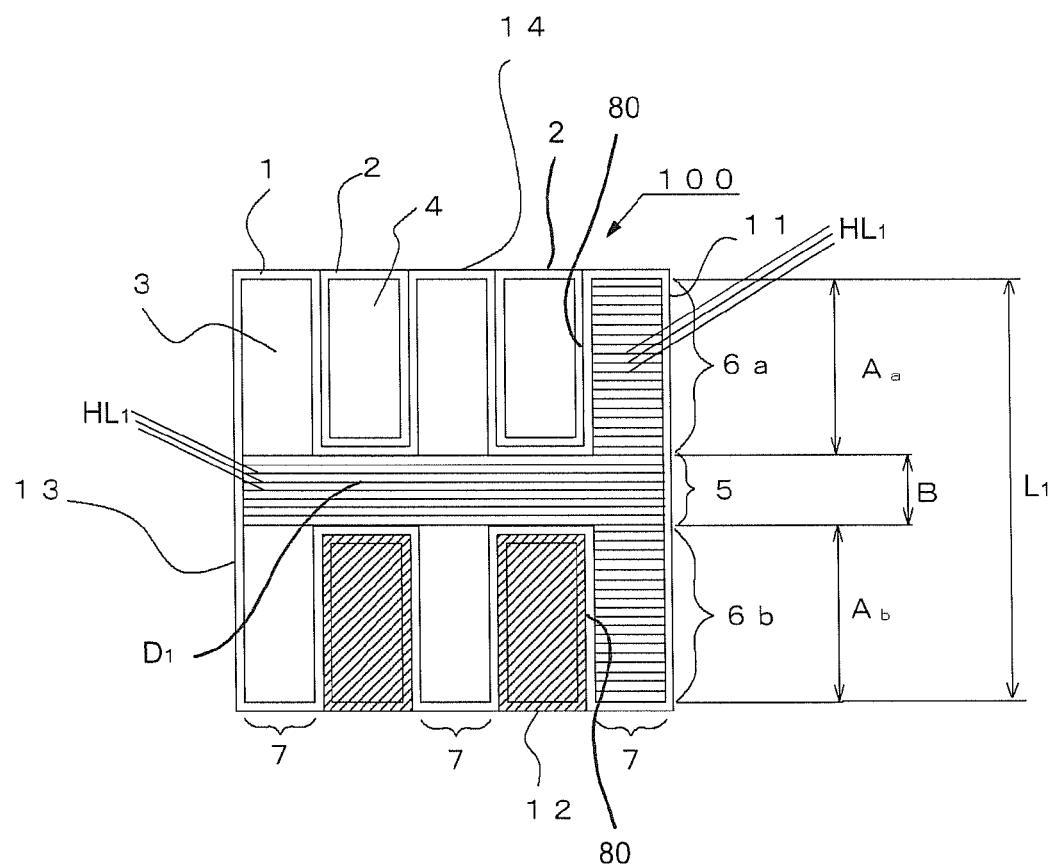
FIG. 1 is a schematic plan view showing a semiconductor light emitting element according to first embodiment of the present invention.

The embodiments will now be described with reference to the accompanying drawings, wherein like reference numerals designate corresponding or identical elements throughout the various drawings.

First Embodiment

Figure 2A:
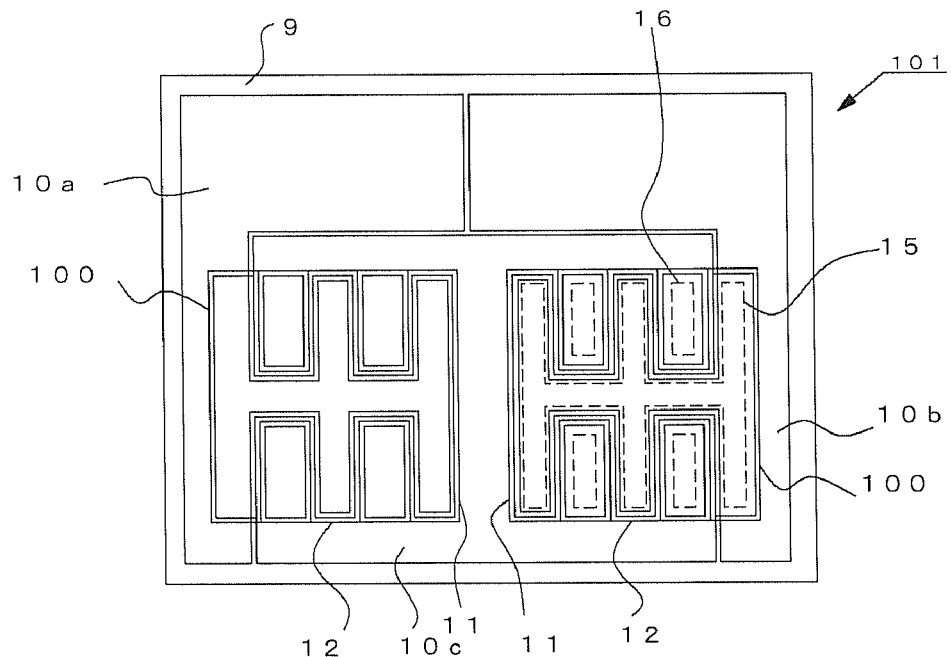
FIG. 2A is a schematic plan view showing an outer appearance of a top surface of a light emission device according to the first embodiment of the present invention.
Figure 2B:
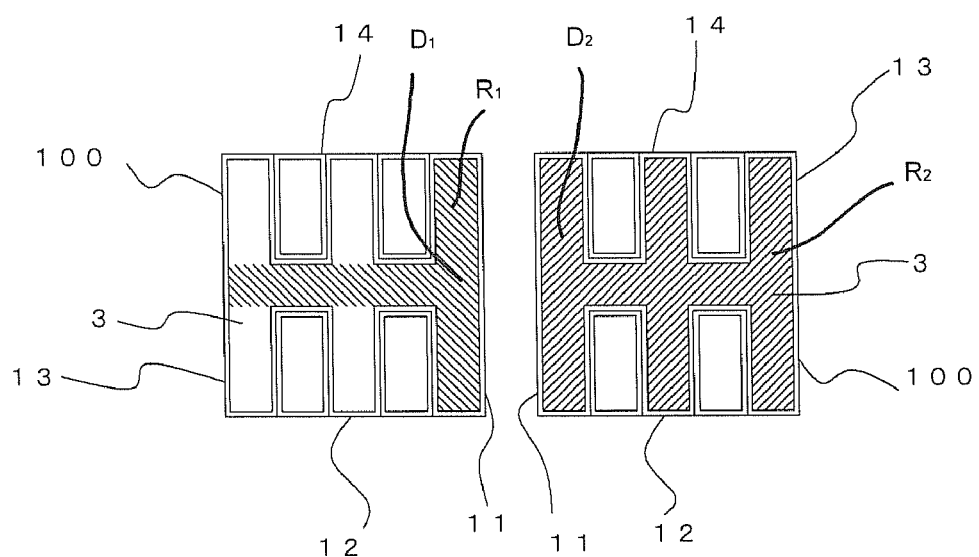
FIG. 2B is a plan view schematically showing regions of area $R_1$ and $R_2$ of the light emitting element according to the first embodiment of the present invention.

FIGS. 1, 2A, and 2B are schematic top views showing a semiconductor light emitting element 100 and a light emission device 101 according to the present embodiment.

The semiconductor light emitting element 100 shown FIG. 1 includes a light emitting region 1 including a stacked structure of a second semiconductor layer and a first semiconductor layer in plan view in which the first semiconductor layer of a first conductivity type and the second semiconductor layer of a second conductivity type are formed in order on a transparent substrate, and at least one part of the first semiconductor layer is exposed from the second semiconductor layer; and an exposure part 2 which is an exposed region where the first semiconductor layer is exposed. The semiconductor light emitting element 100 has a substantially rectangular shape. A second electrode 3 is arranged at the surface of the second semiconductor layer of the light emitting region 1 and a first electrode 4 is arranged at the surface of the first semiconductor layer of the exposure part 2, and the light can be exited from the end face of each side. The light exited from the end face on a first side 11 of the semiconductor light emitting element 100 is stronger than the light exited from the end face of a second side 12.

As shown in FIG. 2A, the semiconductor light emitting element 100 shown in FIG. 1 is flip-chip mounted on a supporting substrate 9 with the first side 11 arranged substantially parallel and facing each other in a line form. In the light emission device 101 of FIG. 2, two light emitting elements 100 of the same structure are mounted side by side, wherein each element is connected to conductor wirings 10a to 10c on the surface of the supporting substrate 9 through a conductive member such as a bump. As shown in FIG. 2A, an external connection region 15 of the second electrode and an external connection region 16 of the first electrode of one element are connected to different conductor wirings.

According to such light emission device 101, the light exited from the end face of each element can be efficiently reflected at the opposing end faces of the two light emitting elements and the loss of the light by the light absorbed in the supporting substrate etc. can be suppressed, so the light retrieving efficiency can be enhanced. In other words, as shown in a conceptual diagram in FIG. 4, when a plurality of semiconductor light emitting elements are flip-chip mounted adjacent to each other so that the end face of each element faces each other substantially in parallel, the light exited from the end face of one light emitting element can be reflected by the end face of the other element, whereby the light can be retrieved to the light emission observing surface side, typically, the transparent substrate side. In the light emission device 1 of the present embodiment, since two elements are arranged so that the first side 11 having the light exited from the end face stronger than the second side 12 faces each other, the light reflected at the opposing element end faces and retrieved to the light emission observing surface side becomes stronger than when the second sides 12 are faced to each other.

Specifically, as shown in FIG. 2B, the semiconductor light emitting element 100 has an area $R_1$ of a region indicated by downward-sloping diagonal lines smaller than an area $R_2$ of a region indicated by upward-sloping diagonal lines. $R_1$ is an area of a first region $D_1$ on the second electrode 3. Referring to FIG. 1, the first region $D_1$ is defined on the second electrode 3 by a group of first hypothetical lines $HL_1$ extending on the second electrode 3 perpendicularly to the first side 11 from the first side 11 to either one of a third side 13 of the semiconductor light emitting element 100 opposite to the first side 11 or a first exposure side 80 of the exposure part 2 of the first semiconductor layer facing the first side 11, which the first hypothetical lines $HL_1$ on the second electrode 3 first reach. $L_1$ is a length of the first side 11. Returning to FIG. 2B, $R_2$ is an area of a second region $D_2$ on the second electrode 3.

Figure 21:
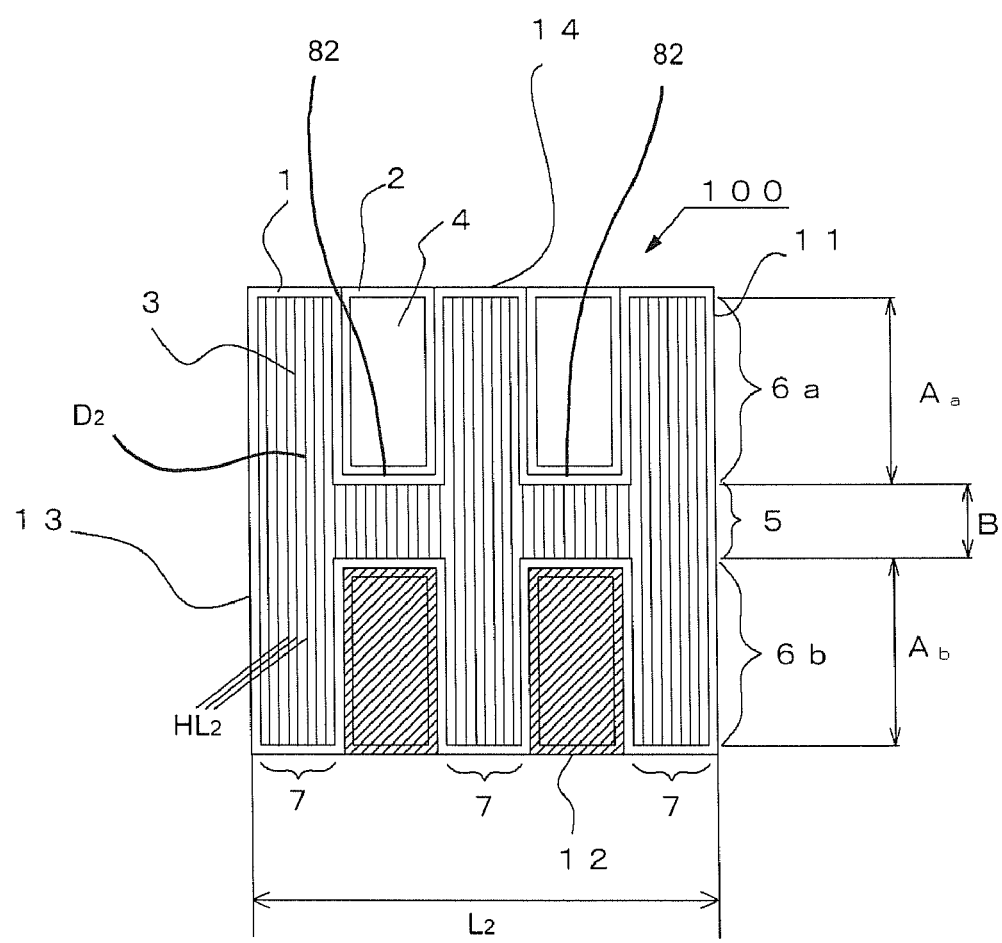
FIG. 21 is a schematic plan view showing the semiconductor light emitting element according to the first embodiment of the present invention.

Referring to FIG. 21, the second region $D_2$ is defined by a group of second hypothetical lines $HL_2$ extending on the second electrode 3 perpendicularly to the second side 12 from the second side 12 to either one of a fourth side 14 of the semiconductor light emitting element 100 opposite to the second side 12 or a second exposure side 82 of the exposure part of the first semiconductor layer, which the second hypothetical lines $HL_2$ on the second electrode 3 first reach. $L_2$ is a length of the second side 12. In the element for flip-chip mounting, typically, the second electrode is arranged over substantially the entire surface of the light emitting region, and the shape and the area of the second electrode are substantially the same as the light emitting region, and thus the description related to the second electrode and the light emitting region, for example, $R_1$, $R_2$, a narrow region, an extending part, to be described below, may be adopted for the second electrode or the light emitting region.

As in the semiconductor light emitting element 100 shown in FIG. 2B, in the light emitting element where the area $R_1$ of the region indicated by downward-sloping diagonal lines is smaller than the area $R_2$ of the region indicated by upward-sloping diagonal lines, the light of small attenuation, as described below, can be exited from the end face of the first side 11, and the light reflected at the end face of the first side 11 of each element and retrieved becomes stronger. The semiconductor light emitting element 100 has the light emitting region 1 arranged with the second electrode 3 emitting light. Thus, the distance that the light exited from the end face of the first side 11 transmit through the element is reduced as a whole by reducing the area $R_1$ of the region indicated by downward-sloping diagonal lines in FIG. 2B. Accordingly, as shown in the conceptual diagram of FIG. 4, the light absorbed in the element before being exited from the end face of the first side 11 is reduced, and the attenuation of the light exited from the first side 11 is suppressed. The distance that the light exited from the end face of the second side 12 transmits through the element is large as a whole than the distance that the light exited from the end face of the first side 11 transmits through the element, and thus the light exited from the end face of the second side 12 tends to be absorbed in the element before being exited, and the attenuation tends to become large. Therefore, as shown in FIG. 2B, the attenuation of the light exited from the end face of the first side 11 is relatively suppressed by obtaining an element in which the area $R_1$ of the region indicated by downward-sloping diagonal lines is smaller than the area $R_2$ of the region indicated by upward-sloping diagonal lines, where a light emission device with enhanced light retrieving efficiency is obtained by arranging a plurality of light emitting elements so that the end faces face each other.

The second electrode 3 of the semiconductor light emitting element 100 includes narrow regions 6a and 6b (a first narrow region) sandwiched by the first side 11 and the exposure part 2, and an extending part 5 extending towards the inner side of the element than the narrow regions 6a and 6b. In other words, the light emitting region 1 of the semiconductor light emitting element 100 includes linear independent parts 6a and 6b arranged on the first side 11 of the semiconductor light emitting element 100, and a connection part 5 for connecting the independent parts 6a and 6b to the inside of the element in plan view. A length $A_1$ of the first narrow region 6a and 6b along the first side 11 is the sum of the length $A_a$ of the narrow region 6a and the length $A_b$ of the narrow region 6b. The length $A_1$ ($=A_a+A_b$) of the first narrow region 6a and 6b along the first side 11 is longer than the length B of the extending part 5. The surfaces of the narrow regions 6a and 6b and the extending part 5 are covered with the second electrode 3. The second side 12 adjacent to the first side has the light emitting region 1 configured by an extending part 7.

In the case of the light emitting element in which the narrow regions 6a and 6b longer than the extending part 5 are arranged on the first side 11 facing another element, as in the semiconductor light emitting element 100 shown in FIG. 1, light with small attenuation can be exited from the end face of the first side 11, as described below, and the light reflected at the end face of the first side 11 of each element and retrieved can be intensified. The semiconductor light emitting element 100 shown in FIG. 1 emits light in the light emitting region 1 arranged with the second electrode 3. Thus, the narrow regions 6a and 6b of the second electrode 3 are arranged at positions closed to the first side 11, thereby reducing the light absorbed in the element before being exited from the end face of the first side 11 and suppressing the attenuation of the light exited from the first side 11. The extending part 5 is extended to the inside of the element than the narrow regions 6a and 6b, the light generated in the extending part 5 is absorbed in the element before being exited from the first side 11 and the attenuation tends to become large. Therefore, as shown in FIG. 1, the length of the narrow regions 6a and 6b on the first side 11 is made longer than the extending part 5 to relatively suppress the attenuation of light exited from the end face of the first side 11, and a plurality of light emitting elements is arranged so that the end faces of the first side 11 face each other to obtain a light emission device with enhanced light retrieving efficiency.

The intensity of light exited from the end face is preferably larger than the second side different from the first side, that is, the plan shape of the light emitting region and the distance from the light emitting region to each side is preferably differed between the first side and the second side. The light emitting region of each side will be described in detail below.

[Light Emitting Element and Light Emitting Region Thereof]

As described in the first embodiment, the light emitting element according to an embodiment of the present invention has a special structure for the second electrode at the sides facing each other, that is, the first side in a plurality of elements arranged adjacent to each other on the supporting substrate, or has a special structure for the second electrode at the second side and the first side if the second side is a side that is not adjacent to other elements, so that a light emission device excellent in light emission output is obtained. The main configuration thereof and the following first to third configurations will be described below.

The first configuration is a configuration which may include first and second configurations described below depending on the structure of the element, that is, in the opposing direction of the first side, the size of the opposing region of the first side and the far distant end of the light emitting region or the second electrode, specifically, size of the area of the region sandwiched by end facing the end on the first side of the light emitting region or the second electrode such as the end on the opposing side of the first side, and the first side is designed to a special structure to exit the light of light emission intensity suited in arranging the elements side by side from the first side. In combining the first configuration and the third configuration described below, the suitable light emission device can be obtained with the specific structure in which the partial region of the second electrode on the first side is desirably designed according to the difference between region S sandwiched by the first side and the light emitting region end on the first side in the third configuration described below and the region sandwiched by the first side and the second electrode end facing the first side end in the first configuration. The area of each region is standardized with the length of each side and evaluated when comparing two or more sides.

In the second configuration, the second electrode or the light emitting region has a specific structure at the first side adjacent to other elements, that is, has narrow regions and the extending part, and the proportion occupying the first side is designed, so that the light of light emission intensity suited for arranging the elements side by side is exited from the first side.

In the third configuration, the distance between the first side and the second electrode or the light emitting region is reduced. Specifically, the distance of the end of the second electrode or the light emitting region on the first side, that is, the end of close distance from the first side, and the first side is made small compared to that of the second side, so that the light of light emission intensity suited for arranging the elements side by side is exited from the first side.

Figure 4:
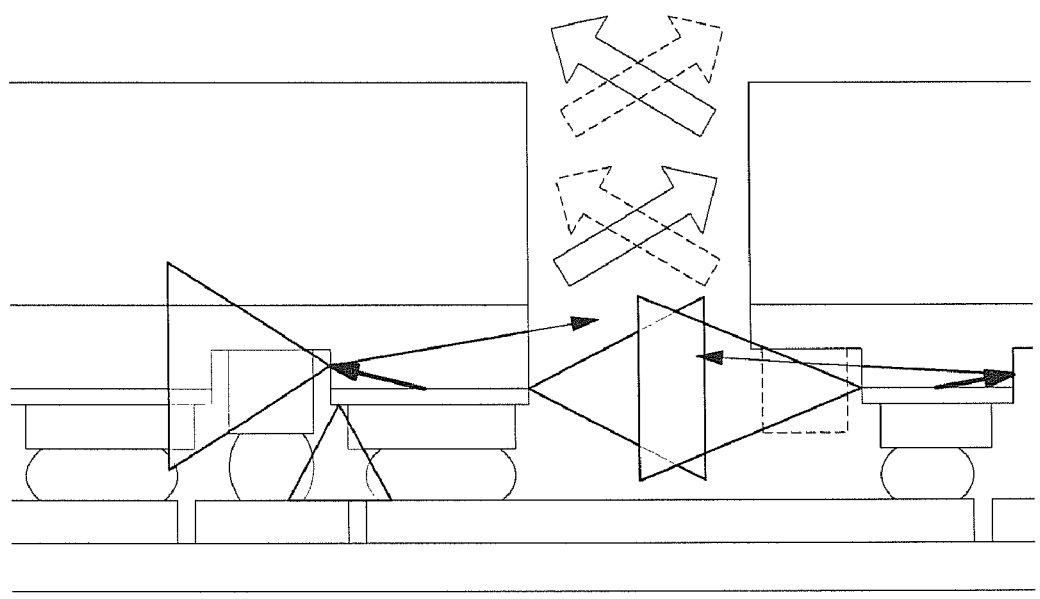
FIG. 4 is a conceptual diagram describing an embodiment of the present invention.

As shown in FIG. 4, in the first configuration, the rear surface side end or the far distance end facing the light emitting region end on the first side, that is, the close distance end, is arranged at a distance close to the end face of the element on the first side when seen from the first side. In other word, the end of the light emitting region on the side opposite to the first side end of the light emitting region, that is, rear surface side end, is arranged at a distance close to the end face on the first side. Therefore, the internal reflection surface of the light emitting region is arranged close to the first side, and the light therefrom can be intensified. Furthermore, as shown in FIG. 4, light absorption occurs inside due to repeated reflection at the inside of the light emitting region on the first side, but such light absorption can be suppressed by reducing the transmission distance inside the light emitting region. That is, in the light emitting region on the first side, the distance with the rear surface side end is preferably reduced, or the width of the light emitting region, the distance between the first side end and the rear surface side end, and the partial region of the light emitting region are preferably reduced, and more preferably, all of the above are satisfied. Specifically, in comparison of the first side facing the adjacent element and the side not facing the adjacent element but facing the outer side of the adjacent element such as the side facing the window part or the reflection part of the light emission device including the second side, the side facing the adjacent element such as the first side has smaller the width, the distance, and the region area, which are described above, compared to the non-facing side.

Apart from the first configuration, in the third configuration, the light emitting region end acting as the light exit end face can be arranged close to the end of the element by reducing the distance between the first side and the light emitting region end on the first side, that is, by reducing the area of the region sandwiched by the first side and the light emitting region end thereof, whereby the light of the end of the element can be intensified and a light suited for reflection at the end of the adjacent element can be exited, as shown in FIG. 4. The light exit of suitable light emission output and reflection by adjacent element can be obtained by being used in combination with the first configuration, where the light emission device excellent in light output can be obtained as a result. The intensity of light of each side is evaluated with the entire region area in the side integrating the narrow region and other parts, the distance between the side and the rear surface end, such as the areas S, R to be described below. This is the same for the third configuration and for the distance and the area between the light emitting region and each side.

A structure for realizing the first configuration, the third configuration, and each mode related thereto includes the first embodiment and other embodiments or a structure of the light emitting region in which the narrow regions and the extending part to be described below are arranged on the first side, whereby the second configuration is obtained. Specifically, the narrow region has the width and the area of the light emitting region in the first configuration, or the distance between the rear surface side end and the first side smaller than other parts such as the extending part, where the narrow region serves as a portion that exits strong light compared to other parts such as the extending part in the light emitting region on the first side, whereby the light emitting element structure suitably using the same such as the structure in which the size, shape, distance with the first side, and the like are suitably designed is obtained. The structure related to the mode of each configuration will be described below. The first side facing the adjacent element and the second side, which is the non-facing side or different from the first side, have been described, but the above description is also applicable to other sides of the element. If three or more elements arrayed, each opposing side is preferably assumed as the first side if there are two or more adjacent elements.

(Area of Light Emitting Region)

In addition to the length of the narrow region and the extending part, the area of the light emitting region on each side related to the first configuration may be differed between the first side and the second side to change the intensity of light exited from the end face of each side. Specifically, in plan view, the ratio R/L of the area R of the region sandwiched by the end of the second electrode closest to one side of the element and the end of the second electrode closest to the relevant one side after the relevant end, and the length L of the relevant side is such that R1/L1 of the first side is smaller than R2/L2 of the second side. Thus, in view of the entire light emitting region, the distance that the light generated in the light emitting region transmits through the element before being exited from the end face of the element becomes shorter on the first side than on the second side, and the element in which the light exited from the first side is strong is obtained.

(Distance Between Each Side and Light Emitting Region)

According to a mode related to the third configuration, the light quantity of the light from the light emitting region reaching the end face of another adjacent element can be increased by reducing the distance from the first side to the light emitting region. The distance to the light emitting region is preferably substantially equal with the first side and the second side, or the first side is closer. Specifically, when one side serves as the reference, a region between the reference side and the light emitting region facing the reference side is preferably small in plan view. For instance, the ratio S/L of an area S of the region sandwiched by the reference side and the opposing side of the reference side or the light emitting region arranged closer to the reference side than the opposing side, and a length L of the reference side is such that S1/L1 of the first side is substantially equal to S2/L2 of the second side, or S1/L1 of the first side is preferably smaller than S2/L2 of the second side. The attenuation of the light exited from the end face of the first side is smaller than or substantially equal to that of the second side to increase the light quantity.

For instance, S/L of a first set including the first side and the opposing side thereof is smaller than S/L of a second set including opposing sides different from the first set, or the sides of each set may have the same S/L. That is, if the second side is the side different from the opposing side of the first side, an element in which S/L at the first side and the opposing side of the first side are substantially the same, and S/L at the second side and the opposing side of the second side are substantially the same is obtained, and where S/L of the first side may be smaller than S/L of the second side. In this case, the sides of each set are substantially the same S/L, and an element with such two sets of sides preferably has a rectangular shape in plan view. Thus, by having the distance between the side and the light emitting region closer in the first side and the opposing side than in a different set, the attenuation of light exited from the end face of the first side and the opposing side thereof can be made smaller than the side of a different set, and the light exited from the end face can be intensified.

In the element of FIG. 1, S/L is substantially the same at the first side 11 and the opposing side 13, and is substantially the same at the side 12 adjacent to the first side 11 and the opposing side 14. FIG. 1 shows a region between the side 12 and the light emitting region facing thereto, specifically, a region indicated by diagonal lines sandwiched by the side 12 and the opposing side 14 or the light emitting region 1 arranged closer to the side 12 than the side 14. At the first side 11 and the opposing side 13, the end of the light emitting region 1 and each side coincide, the region between the first side 11 and the light emitting region 1 does not exist, and S/L is zero, whereby S/L of the first set is smaller than S/L of the second set.

S/L of the first set and the second set may be substantially equal. Since the light emitting region is arranged at a distance substantially equal from each side, an element in which the intensity of the light exited from the end face of each side tends to depend on the shape in plan view of the light emitting region is obtained. In an element where S1/L1 of the first side is smaller than S2/L2 of the second side, the effect of facing the first side of each element, that is, the effect of increasing the light emitting output compared to when the second side is faced is enhanced compared to when S1/L1 and S2/L2 are substantially equal.

The structure including the narrow region and/or the extending part according to the first configuration, and the structure related to the mode of each configuration will be described below.

(Length of Narrow Region and Extending Part)

In the structure according to the second configuration, the proportion occupying the first side of the narrow region exiting a relatively strong light than other part of the second electrode or the light emitting region is increased at the first side facing the adjacent element, so that strong light can be exited at the first side end of the element, and light suited for reflection at the opposing side of the adjacent element, that is, the end of the adjacent element, can be exited. Specifically, as in the first embodiment, the proportion of the narrow region occupying the second electrode or the light emitting region at the first side is made larger than the other portion such as the extending part in which the width of the light emitting region, the distance with the rear surface end, and the area of each region according to the first configuration is small. The proportion occupied by the narrow region is preferably greater than or equal to half, more preferably, greater than or equal to ⅔ of the length of the side. The proportion of each part occupying each side is evaluated as the ratio of the length of each part such as narrow region A or extending part B in the direction of the side in the length L of each side, that is, the proportion A/L occupied by the narrow region, the proportion B/L occupied by the extending part, and the proportion (L−A)/L occupied by other portion such as non-narrow region.

In comparison with the second side, since the second side is specifically the side that does not face the adjacent element, the narrow region in the side different from the first side facing the adjacent element and the narrow region at the first side are compared. The light emitting region on the second side includes an extending part and includes the narrow region shorter in the length direction of the second side than the extending part, or is formed with the extending part. In the ratio A/L of the length A of the narrow region of the light emitting region and the length L of the side, A1/L1 of the first side is preferably larger than A2/L2 of the second side. Thus, an element in which the extent of attenuation of the light exited from the second side is larger than the light exited from the first side, and the intensity of the light exited from the end face is larger on the first side than on the second side is obtained. As in the element shown in FIG. 1, if the light emitting region on the second side is formed by the extending part, the length A2 of the narrow region of the second side is zero. Furthermore, in the ratio A/B of the length A of the narrow region and the length B of the extending part, A1/B1 of the first side is preferably larger than A2/B2 of the second side.

In the ratio A/L of the length A of the narrow region and the length L of the side, A1/L1 of the first side may be substantially equal to A2/L2 of the second side. In this case, the distance that the light generated at the narrow region passes through the element can be relatively reduced by having the width of the narrow region on the first side smaller than the width of the narrow region on the second side, and the extent of attenuation of the light exited from the first side can be made smaller than the second side. A structure in which the area R of the first side is smaller than the second side may be obtained by comparing the distance between the rear surface side end and each side, that is, the area R of the region sandwiched by the rear surface side end and each side in addition to the width of the second electrode or the light emitting region.

(Opposing Side of First Side)

Figure 22:
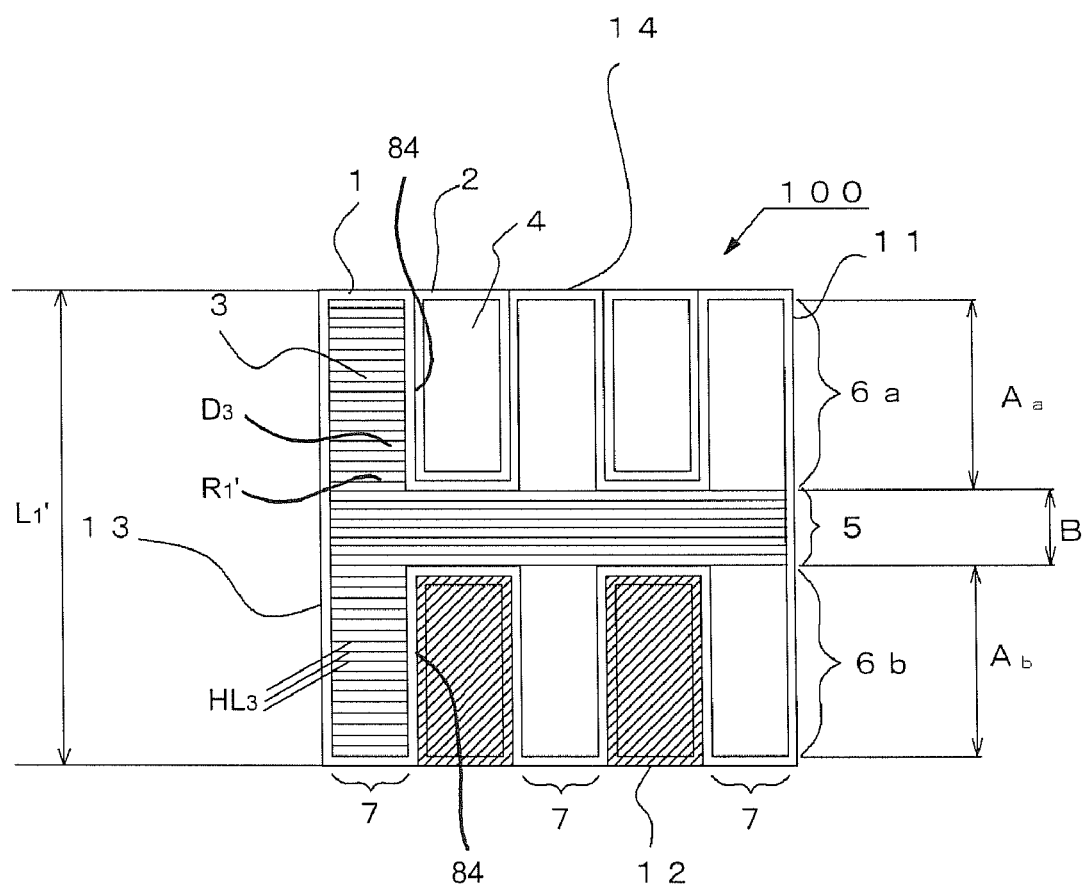
FIG. 22 is a schematic plan view showing the semiconductor light emitting element according to the first embodiment of the present invention.

The opposing side of the first side preferably has the following configuration. A ratio R1'/L1' of R1' to L1' is substantially equal to the ratio R1/L1. Referring to FIG. 22, R1' is an area of a third region D3 on the second electrode 3. The third region D3 is defined by a group of third hypothetical lines HL3 extending on the second electrode 3 perpendicularly to the third side 13 from the third side 13 to either one of the first side 11 or a third exposure side 84 of the exposure part 2 of the first semiconductor layer, which the third hypothetical lines HL3 on the second electrode first reach. L1' is a length of the third side 13. The second electrode on the opposing side of the first side includes the narrow region and the extending part, similar to the first side, and is formed such that the length in the opposing side direction of the narrow region becomes longer than the extending part. According to such configuration, the attenuation of light is also suppressed at the end face of the opposing side, strong light can be exited from the end face of the opposing side, and it is preferable especially when also arranging another element on the opposing side. As in the element shown in FIG. 1, the intensity of light exited from the end face of the opposing side becomes similar to the first side by having the same shape in plan view of the light emitting region in the first side and the opposing side.

(Second Electrode or Each Part of Each Side and Arrangement)

The narrow region of the second electrode is a portion spaced apart from the inside of the element or the second electrode of the opposing side by the exposure part or the exposed region of the first semiconductor layer on each side, that is, the light emitting region sandwiched by the separation part of the exposed region etc. and each side, where the second electrode is also arranged on the opposing side of the separation part. The narrow region of the first side is preferably arranged on the first side than the first electrode arranged in the exposed region. As shown in FIG. 4, the narrow region can be arranged close to the first side, and the light from the end face of the light emitting region can be retrieved from the first side without being shielded by the first electrode. In order to retrieve the light from the end face without being shielded by the electrode, the end face of the semiconductor layer of the first side or each side preferably includes a light exit exposed surface on at least one part, and more preferably has substantially the entire end face as the light exit surface. Specifically, a structure exposed from a light shielding metal such as a structure exposed from the reflection film or the electrode or a structure covered with transparent protective film is preferable. The end face of at least the light emitting layer is preferably exposed if the light emitting layer is arranged between the second semiconductor layer and the first semiconductor layer.

The light emitting element is arranged with the exposure part of the first semiconductor layer including the first electrode region having the first electrode arranged at one part, and the light emitting region in the remaining region. The exposure part is the non-light emitting region. Thus, a suitable light emitting element structure is formed by arranging the narrow region and/or the extending part on the first side and other sides, and using the first to the third configuration and the modes thereof described above. At the first side, a suitable light is obtained from the end face by including the narrow region, in which case the extending part may not be arranged. However, as described in the first and the third configurations, the light emitting region becomes a narrow width region or a small area region by reducing the distance with respect to the first side or the region area, and thus the external connection region arranged on the second electrode thereon becomes small or the region becomes difficult to form. This problem is solved by arranging the extending part in combination with the narrow region. In other words, the external connection region can be arranged in the light emitting region on the inner side of the element connected by the extending part or the light emitting region arranged on the opposing side of each side with the exposed region or the first electrode region in between. Thus, a structure in which the proportion of the suitable narrow region of the first and the third configurations occupying the side by the second configuration is high on the desired side such as the first side can be obtained. The proportion of the light emitting area occupying the element becomes larger by arranging the light emitting region extending to the inner side of the element or the opposing side by way of the extending part, and thus current diffusion, uniformity, and light emission uniformity and efficiency can be enhanced, whereby the extending part is preferably arranged.

At one part of the narrow region, the relevant portion can be assumed as the external connection region by being made wider than the other portion and by increasing the area of one portion of the area (S, R) of each region. Therefore, the narrow region may be a structure including a wiring region that is not externally connected and includes a structure of current diffusion and wiring, and an external connection region that is externally connected. At least the wiring region is preferably arranged on the first side, and the non-light emitting region, the light emitting region, the first electrode region and the exposed region in the relevant region, the narrow region and each region thereof and the extending part or other portion are formed depending on the dimension etc. of the element. The external connection region may have the function of the wiring region, and may be arranged with the extending part. In this case, the external connection region may configure the narrow region of the adjacent side adjacent to the side of the extending part. The non-light emitting region mainly includes the exposed region at which the first semiconductor layer of first conductive type on the lower layer side is exposed and the first electrode region arranged at one part thereof, and in addition, may include the substrate exposed region at where the semiconductor layer on the substrate is exposed, the non-current injecting part such as the non-forming region of the second electrode on the semiconductor layer of the second conductive type, the current inhibiting part, and the like.

The light emitting region of each side and the relevant part may be arranged by way of the semiconductor layer exposed region not formed with the electrode, where the end face of each side is preferably made the semiconductor layer end face of the light emitting region so that the distance between the element end face and the light emitting region end face, that is, the region such as hereinafter described as area S can be zero, as shown in the first embodiment. The exposed region of the outer periphery of the element is formed by being separated at the outer periphery thereof as shown in each embodiment described below, and thus leakage of the element is prevented. When having the light emitting region as the element end face, the element is formed by separating the element at the light emitting region.

In the exposed region formed with the first electrode out of the non-light emitting region such as the exposed region of the semiconductor layer, the light emitting region is formed so as to surround the outer periphery of the exposed region so that light emission and the current injection to the light emitting region configuring the relevant outer periphery are efficiently carried out. In particular, when the second semiconductor layer is p-type layer and the first semiconductor layer is n-type layer, the current from the second electrode is efficiently extracted from the entire periphery of the first electrode, and thus is preferable.

Each embodiment related to other examples of the light emitting region in the present invention will be described with respect to FIGS. 5 to 11. In FIGS. 5 to 11, the same reference numerals are denoted for the members same as in FIGS. 1 to 3. In all examples, two elements of the same configuration are flip-chip mounted on the supporting substrate so that the first sides face each other. The conductor wiring of the supporting substrate is omitted, but is arranged in correspondence to each electrode of the element.

Second Embodiment

Figure 5A:
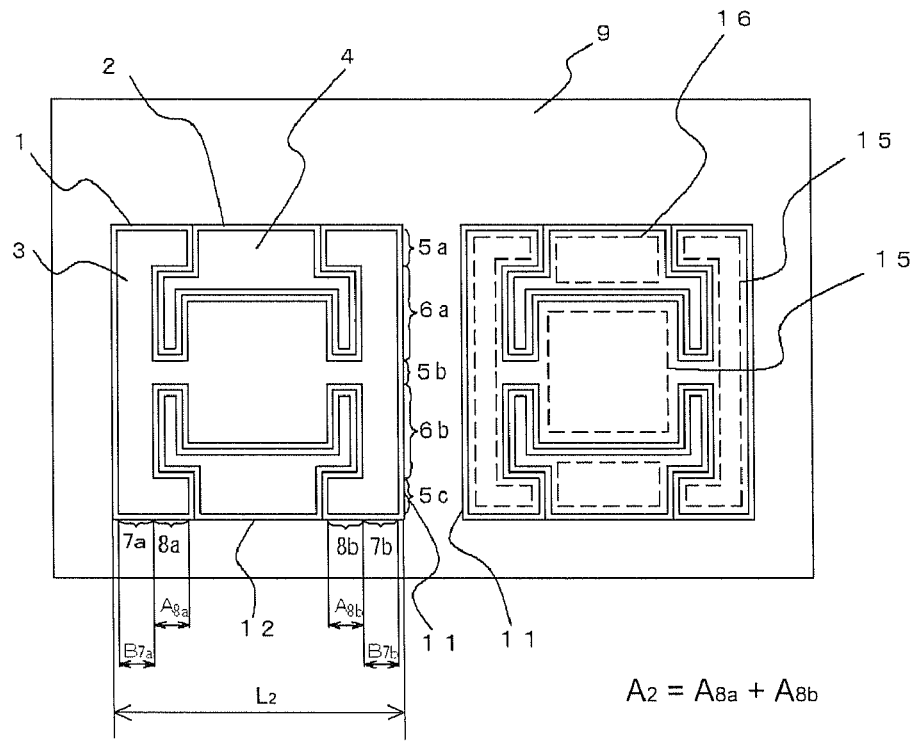
FIG. 5A is a schematic plan view showing a light emission device according to second embodiment of the present invention.

The light emitting element shown in FIG. 5A used in the light emission device of the second embodiment has a configuration including a light emitting region on the inner side of the element and a light emitting region on the outer side of the element. Compared to the first embodiment, the majority of the light emitting region on the outer side of the element is arranged on the first side and the opposing side, the extending part on the first side and the opposing side is arranged at both ends of the first side, one part thereof serves as the extending part and extends to form the narrow region on the adjacent sides of the first side. In addition, the light emitting element shown in FIG. 5A has a line symmetric structure, the center line thereof is parallel to the first side on which the second electrode occupying more than half of the length of the side is arranged, or the adjacent side. The second electrode has the external connection region arranged on the adjacent side, the wiring region extending to the inner side of the element and having narrower width is arranged, and a separation part of the light emitting region on the first side and the opposing side and the separation part of the adjacent side are formed. The second electrode includes the extending part on the inner side of the end of the first side and connects to the inner side light emitting region, and the external connection region is arranged at the extending part and the narrow region at both ends. According to the above configuration, that is, the light retrieved from an axial front surface perpendicular to the semiconductor layer surface can be increased by arranging the light emitting region on the inner side of wide width and large area. Furthermore, an end face light emission suited for the adjacent element arrangement is realized by including the light emitting region on the outer side of narrower width and smaller area than the light emitting region on the inner side.

Figure 5B:
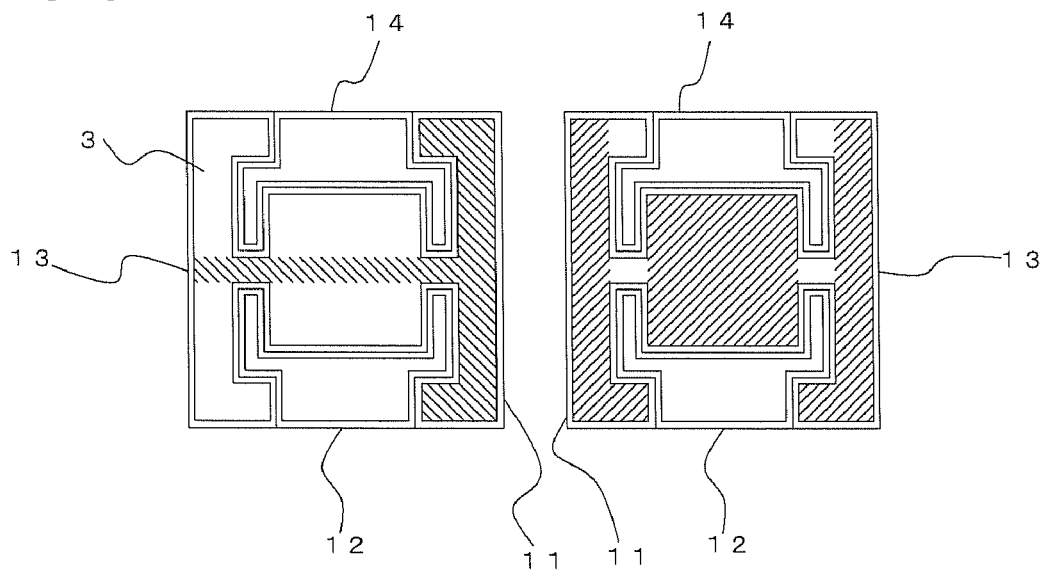
FIG. 5B is a schematic plan view showing regions of area $R_1$ and $R_2$ of a light emitting element according to the second embodiment of the present invention.

In the light emission device shown in FIG. 5A, the second electrode 3 of each semiconductor light emitting element includes narrow regions 8a and 8b and extending parts 7a and 7b on the second side 12 adjacent to the first side 11. The total of the length A8a of the narrow region 8a and the length A8b of the narrow region 8b is substantially equal to the length B7a of the extending part 7a and the length B7b of the extending part 7b in the side direction of the second side 12. The length of the narrow regions 6a and 6b on the first side 11 is longer than the length of the narrow regions 8a and 8b on the second side 12. Since the light emitting element shown in FIG. 5A is substantially a square, the ratio A1/L1 of the length A1 of the narrow regions 6a and 6b on the first side 11 and the length L1 of the first side 11 is greater than the ratio A2/L2 of the length A2 (=A8a+A8b) of the narrow regions 8a and 8b on the second side 12 and the length L2 of the second side 12. The first side 11 and the second side 12 face the first semiconductor layer exposure part 2 on each side and each opposing side in the direction of the opposing side of each side, and the areas R1, R2 of the second electrode 3 of the relevant region are shown in FIG. 5B. The area of the region indicated by downward-sloping diagonal lines in the element on the left side is R1, the area of the region indicated by upward-sloping diagonal lines in the element on the right side is R2, wherein R1 and R2 occupy about 21% and about 49%, respectively, of the area of the entire element. The element shown in FIG. 5B is a substantially square shape in plan view, and thus R1/L1 is smaller than R2/L2. Accordingly, the intensity of the light exited from the end face of the first side is greater than the second side. Substantially a square shape merely needs to be a square to the extent that the effects according to the embodiments of the present invention are obtained. The opposing side of the second side 12 also has a shape similar to the second side 12.

Third Embodiment

Figure 6A:
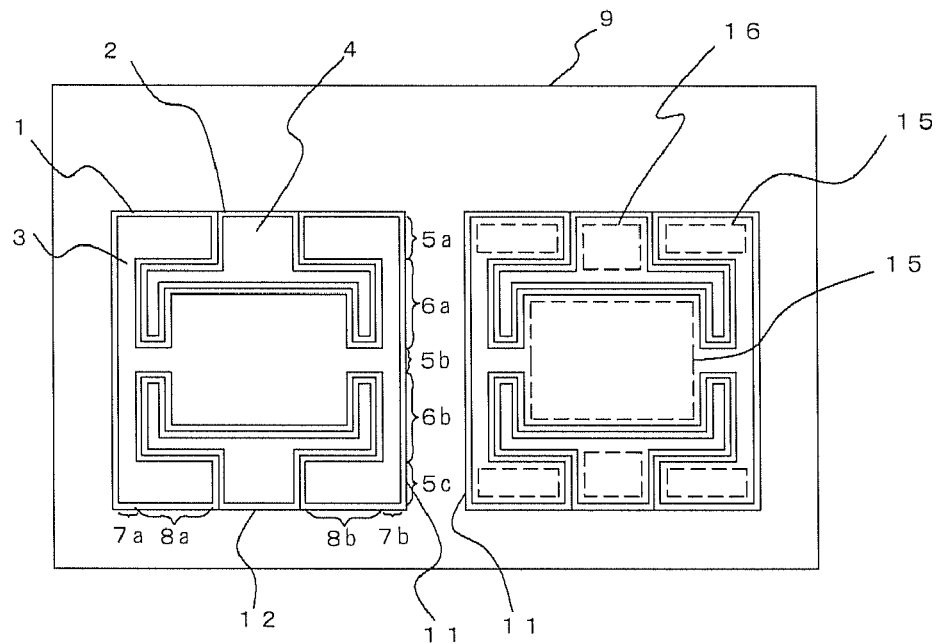
FIG. 6A is a schematic plan view showing a light emission device according to third embodiment of the present invention.

In the light emitting element shown in FIG. 6A used in the light emission device of the third embodiment, the second electrode on the inner side has wider width and larger area compared to the second embodiment, and the width of the narrow region and the area of each region that are one part of the second electrode on the outer side, become smaller. Thus, the external connection region of the second electrode is arranged on the extending part connecting to each part of the adjacent side at both ends of the first side and the opposing side, and the narrow region and the extending part on the inner side on the first side and the opposing side are the wiring region. Thus, the luminance of the end face exit light is enhanced in the light emitting region on the outer side and the front surface luminance is enhanced in the light emitting region on the inner side.

Figure 6B:
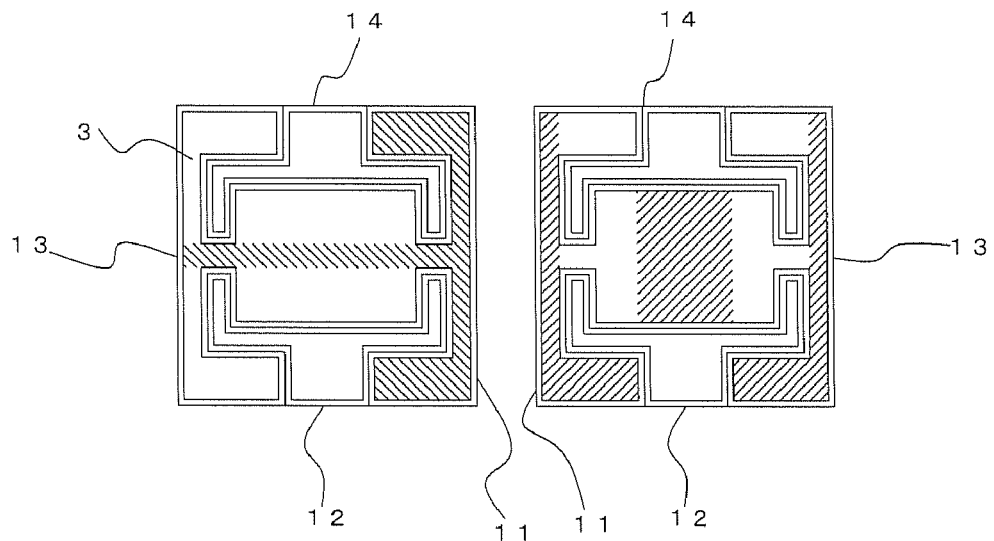
FIG. 6B is a schematic plan view showing regions of area $R_1$ and $R_2$ of a light emitting element according to the third embodiment of the present invention.

The light emission device shown in FIG. 6A differs from the light emission device shown in FIG. 5A in the shape of the second electrode 3 and the light emitting region 1 on the second side 12 of each semiconductor light emitting element. In the semiconductor light emitting element of FIG. 6A, the length of the narrow regions 8a and 8b on the second side 12 is longer than the extending parts 7a and 7b, and the length A1 of the narrow regions 6a and 6b on the first side 11 is substantially equal to length A2 of the narrow regions 8a and 8b on the second side 12, that is, A1/L1 on the first side 11 is substantially equal to the A2/L2 of the second side 12. However, the first side 11 and the second side 12 have different widths for the narrow region on each side, and the width of the narrow regions 6a and 6b on the first side is smaller than the narrow regions 8a and 8b on the second side 12. The first side 11 and the second side 12 face the first semiconductor layer exposure part 2 on each side and each opposing side in the direction of the opposing side of each side, and the areas R1, R2 of the second electrode 3 of the relevant region are shown in FIG. 6B. The area of the region indicated by downward-sloping diagonal lines in the element on the left side is R1, the area of the region indicated by upward-sloping diagonal lines in the element on the right side is R2, wherein R1 and R2 occupy about 20% and about 33%, respectively, of the area of the entire element. The element shown in FIG. 6B has a substantially square shape in plan view, and thus R1/L1 is smaller than R2/L2. Thus, an element in which the light exited from the end face is strong on the first side than the second side.

Fourth Embodiment

Figure 7A:
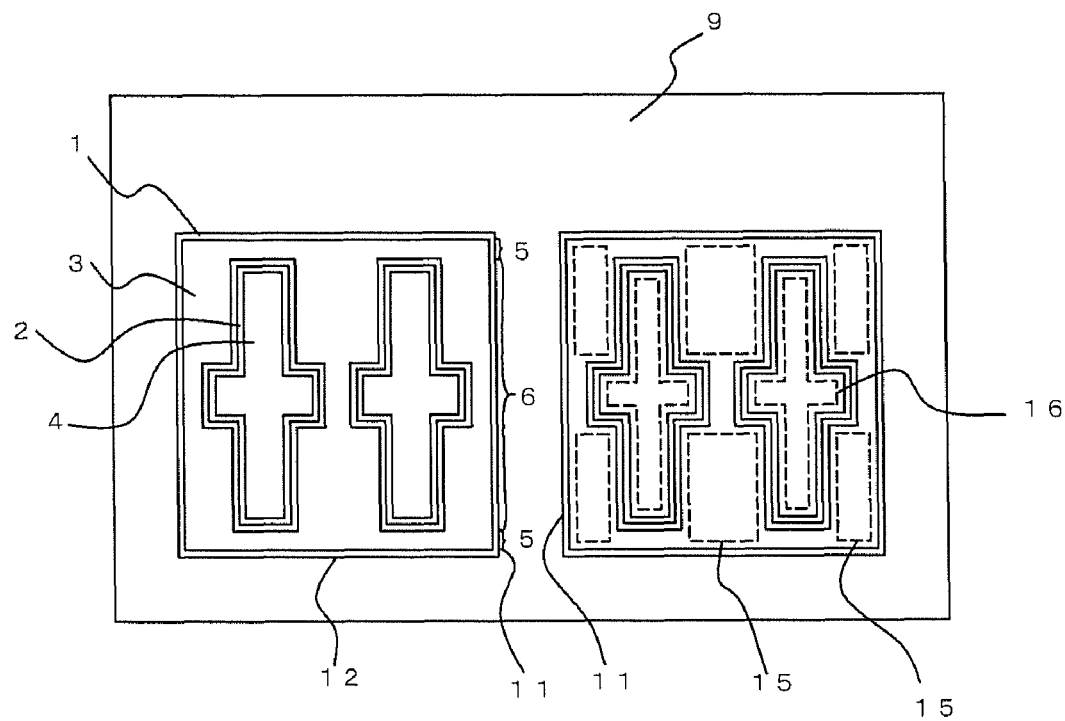
FIG. 7A is a schematic plan view showing a light emission device according to fourth embodiment of the present invention.

The light emitting element shown in FIG. 7A used in the light emission device of the fourth embodiment has structure of the light emitting region in which each side includes the narrow region and the extending part, and the light emitting region on the inner side is arranged as the extending part for connecting the adjacent sides to each other, and the extending part has different width in the opposing direction, and the light emitting region of wide width is arranged on the two adjacent sides facing each other, compared to the second and the third embodiments. The first electrode is arranged on each adjacent side and separated in the opposing direction of the adjacent side in the second and third embodiments, but is separated in the opposing direction of the first side in the fourth embodiment. The narrow region has a structure of different width in the side direction on the first side and the opposing side, the external connection region is arranged on the wide width end side, and the extending part is not arranged on the inner side and the only the extending part on the end side is arranged, unlike to the second and third embodiments. In the light emitting element, the narrow region is arranged on the adjacent side, the first electrode is spaced apart from the side by way of the narrow region, and compared to the second and third embodiments, the light emission of the end from the relevant side becomes intensified, and the difference in distribution of the light emission intensity between the adjacent side, and the first side and the opposing side, is small.

Figure 7B:
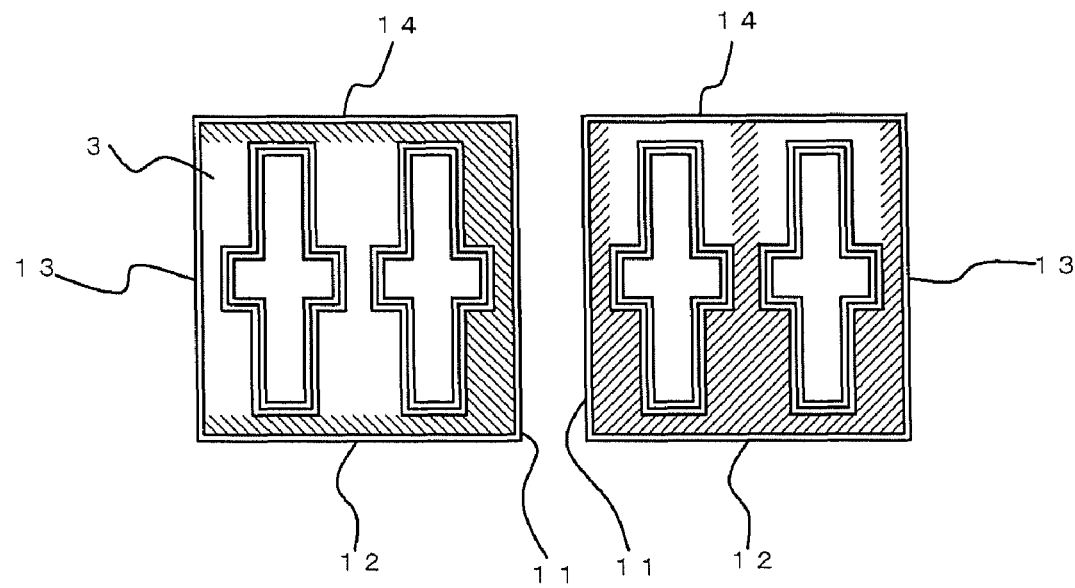
FIG. 7B is a schematic plan view showing regions of area $R_1$ and $R_2$ of a light emitting element according to the fourth embodiment of the present invention.

The light emission device shown in FIG. 7A is arranged so that the light emitting region of each semiconductor light emitting element surrounds the periphery of the exposure portion 2 and the first electrode 4 on the surface thereof. The first side 11 and the second side 12 face the first semiconductor layer exposure part 2 on each side and each opposing side when viewed in the direction of the opposing side of each side, where the areas R1, R2 of the second electrode 3 of the relevant region are shown in FIG. 7B. The area of the region indicated by downward-sloping diagonal lines in the element on the left side is R1, and the area of the region indicated by upward-sloping diagonal lines in the element on the right side is R2, wherein R1 and R2 occupy about 22% and about 35%, respectively, of the area of the entire element. Since the element shown in FIG. 7B is a substantially square in plan view, R1/L1 is smaller than R2/L2. In view of the entire light emitting region, the extent of attenuation of light exited from the first side becomes smaller than the second side. R/L of the opposing sides of the first side 11 and the second side 12 is substantially equal to R/L of the first side 11 and the second side 12 each other.

Fifth Embodiment

Figure 8A:
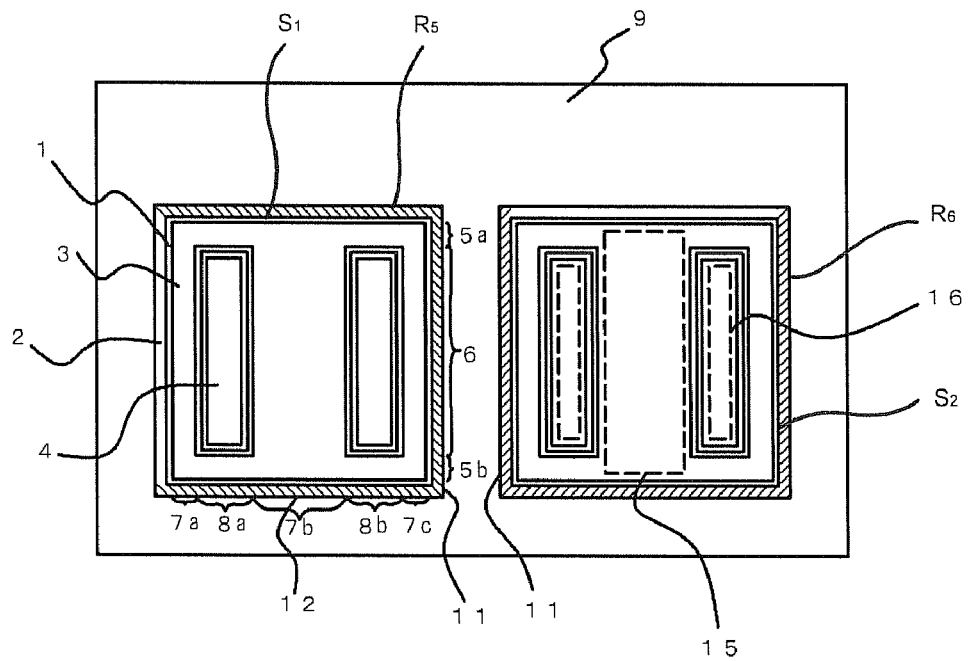
FIG. 8A is a schematic plan view showing a light emission device according to fifth embodiment of the present invention.

Compared to the fourth embodiment, the light emitting element shown in FIG. 8A used in the light emission device of the fifth embodiment has the external connection region of the second electrode arranged in the light emitting region on the inner side, the second electrode on the outer side in the first side and the opposing side serves as the wiring region with narrower width, the narrow region and the extending part of even width are arranged, and the second electrode on the inner side configures the extending part on the adjacent side. In the entire element, the second electrode of the outer periphery of the same width and the second electrode on the inner side are arranged. The end face light emission of high uniformity is performed on the first side and the second side by the narrow region of even width, and at the adjacent side, the extending part is the same width in the opposing direction, and thus the end face light emission lowers, the light emission difference between the first side and the opposing side and the adjacent side becomes larger than the fourth embodiment, and an element of higher uniformity of light emission than the second and the third embodiments is obtained.

An example in which S/L is substantially equal at all sides is shown in FIG. 8A. In the light emission device of FIG. 8A, each semiconductor light emitting element has the exposure part 2 arranged on the outer periphery and the inside of the element, and the first electrode 4 is formed on the exposure part 2 inside the element. In FIG. 8A, the region having area S1 sandwiched between the first side 11 and the opposing side of the first side or the light emitting region 1 closer to the side 11 than the opposing side is shown with downward-sloping diagonal lines in the element on the left side, and the region having area S2 sandwiched between the second side 12 and the opposing side of the second side or the light emitting region 1 arranged closer to the side 12 than the opposing side is shown with upward-sloping diagonal lines in the element on the right side. The element shown in FIG. 8A has a substantially square shape, where S1/L1 of the first side 11 is substantially equal to S2/L2 of the second side 12 as shown in FIG. 8A.

Figure 8B:
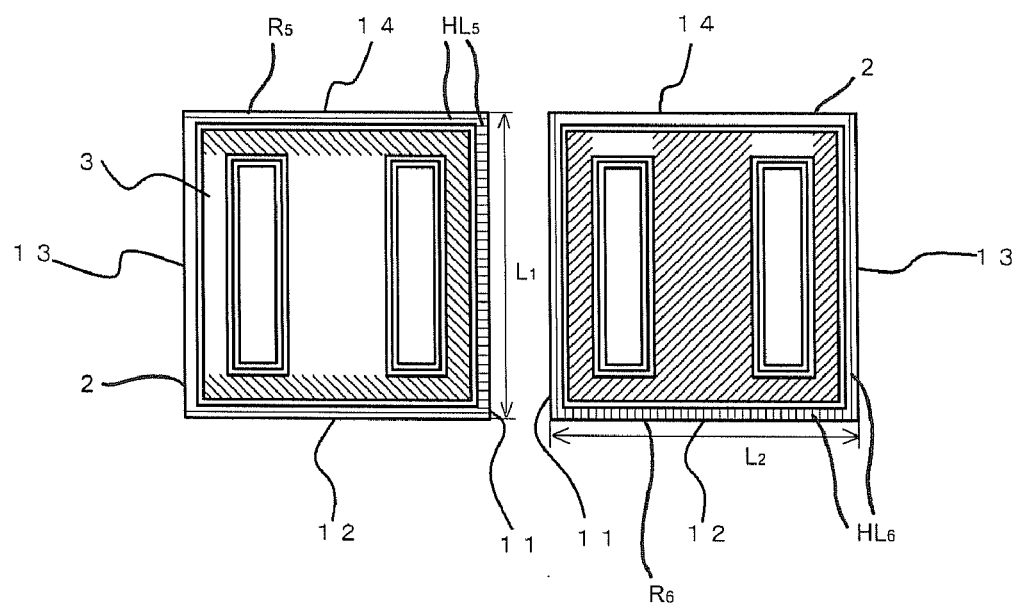
FIG. 8B is a schematic plan view showing regions of area $R_1$ and $R_2$ of a light emitting element according to the fifth embodiment of the present invention.

Namely, the ratio S1/L1 of an area S1 to a length L1 of the first side 11 is substantially equal to the ratio S2/L2 of an area S2 to a length L2 of the second side 12. S1 is an area of a fifth region R5 on the exposure part 2 of the first semiconductor layer. Referring to FIG. 8B, the fifth region R5 is defined by a group of fifth hypothetical lines HL5 extending on the exposure part 2 perpendicularly to the first side 11 from the first side 11 to either one of a third side 13 opposite to the first side 11 or the second semiconductor layer, the fifth hypothetical lines HL5 on the exposure part 2 first reach. L1 is a length of the first side 11. S2 is an area of a sixth region R6 on the exposure part 2 of the first semiconductor layer. The sixth region R6 is defined by a group of sixth hypothetical lines HL6 extending on the exposure part 2 perpendicularly to the second side 12 from the second side 12 to either one of a fourth side 14 opposite to the second side 12 or the second semiconductor layer, which the sixth hypothetical lines HL6 on the exposure part 2 first reach. L2 is a length of the second side 12.

Since the first side 11 and the second side 12 have S/L substantially equal to the opposing sides each other, S/L of all the sides are substantially equal. Thus, effects are easily obtained by the different shape of the light emitting region between each side. The first side 11 and the second side 12 face the first semiconductor layer exposure part 2 and each opposing side when viewed in the direction of the opposing side of each side, wherein the areas R1, R2 of the second electrode 3 of the relevant region are shown in FIG. 8B. The area of the region indicated by downward-sloping diagonal lines in the element on the left side is R1, and the area of the region indicated by upward-sloping diagonal lines in the element on the right side is R2, wherein R1 and R2 occupy about 20% and about 45%, respectively, of the area of the entire element. Since the element shown in FIG. 8B is a substantially square in plan view, R1/L1 is smaller than R2/L2.

Sixth Embodiment

Figure 9:
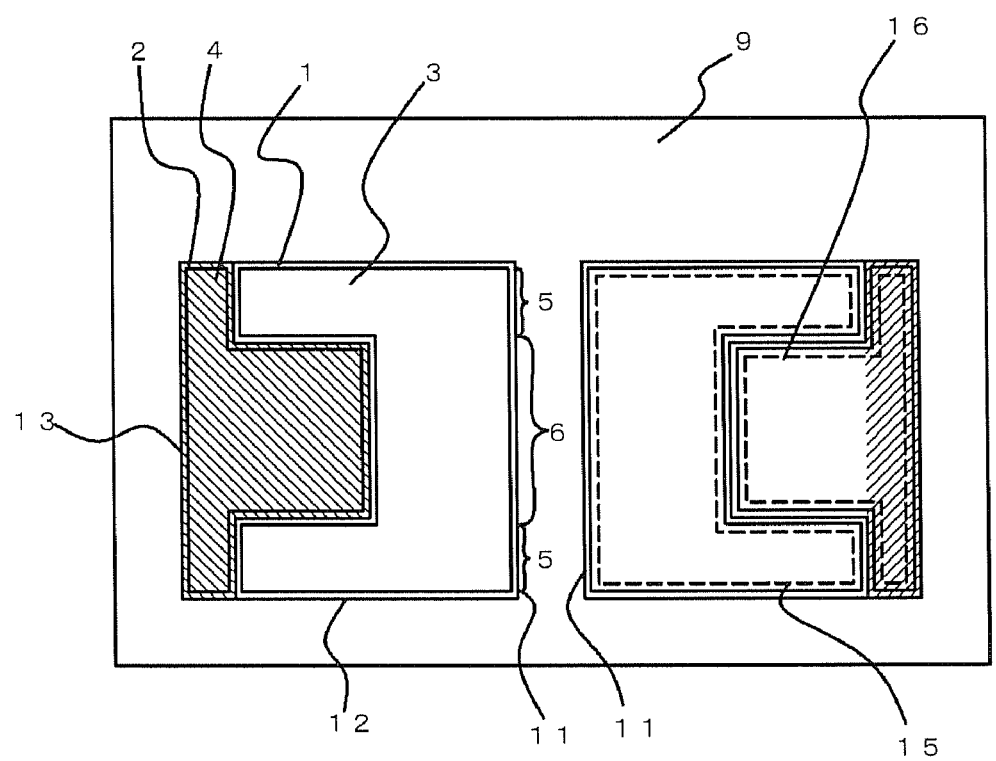
FIG. 9 is a schematic plan view showing a light emission device according to sixth embodiment of the present invention.

Compared to the first to the fifth embodiments, the light emitting element shown in FIG. 9 used in the light emission device of the sixth embodiment has a non-symmetric structure, where the narrow region and the extending part of the second electrode are arranged on the first side 11, the first electrode is arranged on the opposing side 13, and the first electrode includes the wiring region of both ends and the external connection region on the inner side. Similar to the second to the fifth embodiments, the narrow region and the extending part are arranged on the adjacent sides, and the extending parts are connected to each other and arranged on one end of each adjacent side to form each part of the first side. In the relevant element, the first side and the opposing side differ, compared to the first to the fifth embodiments, and thus the light emission difference is large, the difference in the proportion of the narrow region and the extending part occupying each side is small between the first side and the adjacent sides, and similarly, the difference in the value of S/L or R/L of the area S, R of each region at each side is small, and a light emission device of small output difference is obtained even if the adjacent element is arranged on each side.

FIG. 9 shows an example where three types of values of S/L are provided. Each semiconductor light emitting element of the light emission device shown in FIG. 9 has a substantially square shape in plan view. In FIG. 9, the region sandwiched by the opposing side 13 of the first side 11 and the first side 11 or the light emitting region 1 arranged closer to the side 13 than the side 11 is indicated by downward-sloping diagonal lines in the element on the left side, the region sandwiched by the second side 12 and the opposing side of the second side or the light emitting region 1 arranged closer to the side 12 than the opposing side is indicated by upward-sloping diagonal lines in the element on the right side. Such regions do not exist on the first side 11, where S/L is the smallest in the first side 11, and then the second side 12 and the opposing side, and is the largest in the opposing side 13 of the first side. Such elements are arranged so that the first side 11 having the smallest S/L faces each other, as shown in FIG. 9. The narrow region on the side 12 is made longer than the extending part so that the side 12 faces each other, where such configuration is particularly preferable when arranging three or more elements.

Seventh Embodiment

Figure 10A:
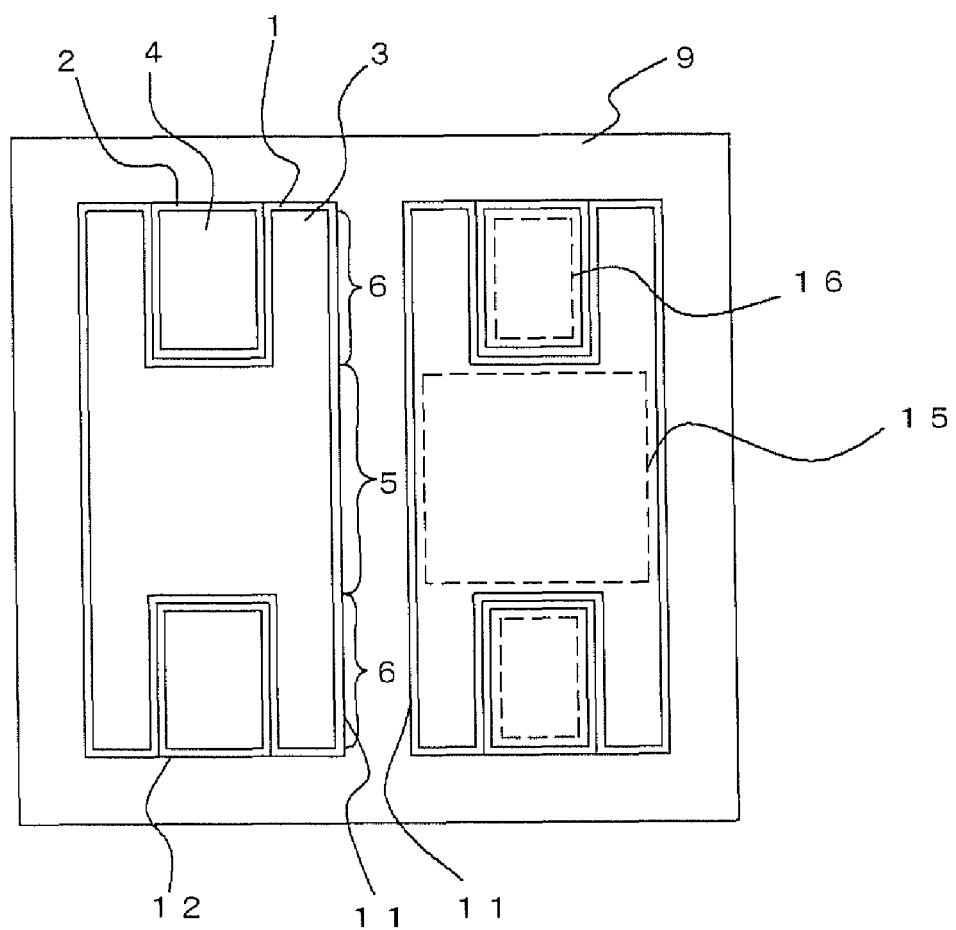
FIG. 10A is a schematic plan view showing a light emission device according to seventh embodiment of the present invention.
Figure 11A:
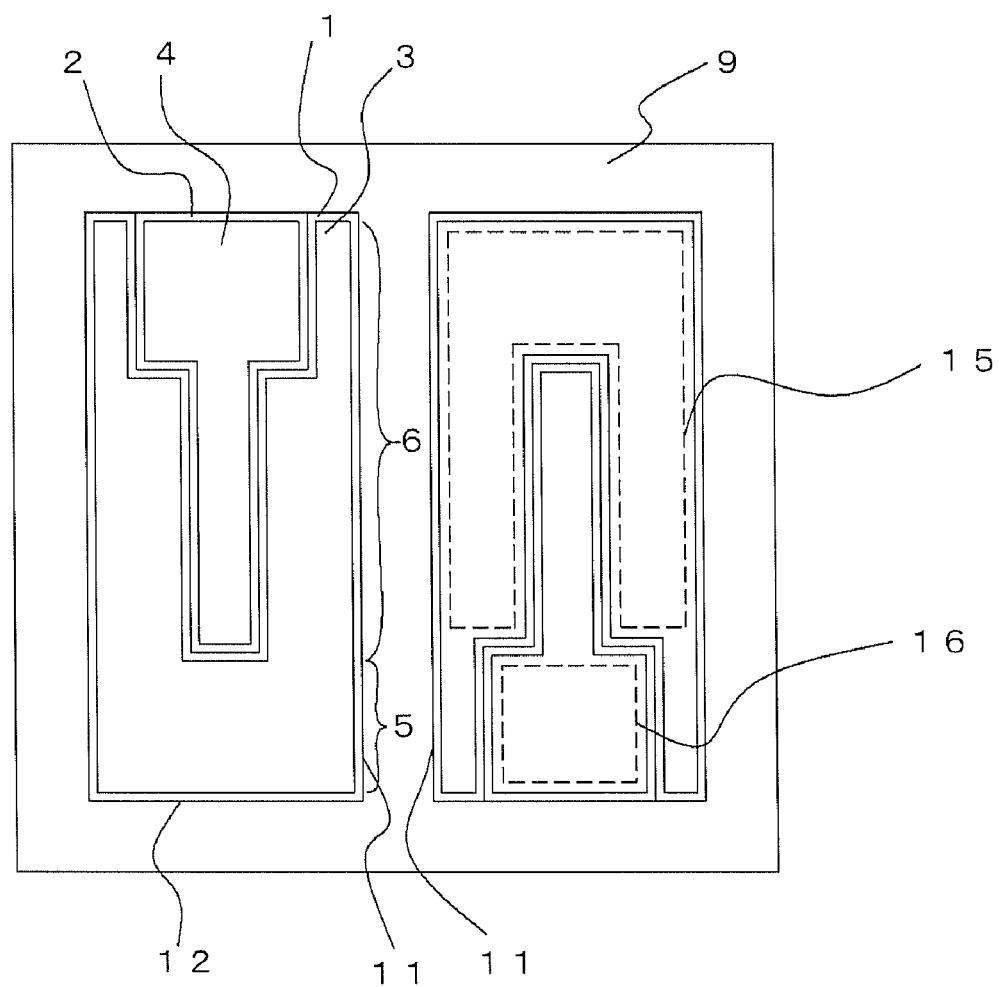
FIG. 11A is a schematic plan view showing a light emission device according to the seventh embodiment of the present invention.

The light emitting element used in the light emission device of the seventh embodiment has a long shape in the example of FIG. 10A compared to the first to the sixth embodiments, where similar to the second and the third embodiments, the first electrode separated in the opposing direction of the adjacent side or the longitudinal direction of the element is arranged on each adjacent side, the second electrode on the inner side configures the extending part on the first side and the opposing side to form a common extending part, similar to the fifth embodiment. Similar to the first embodiment, the narrow region is arranged on the first side and the opposing side, and an element of strong end face light emission on the first side and the opposing side than the adjacent side is obtained. In the example of FIG. 11A, similar to the sixth embodiment or the example of FIG. 10A, difference lies in a structure of longitudinal shape in a non-symmetric direction and the opposing direction of the adjacent side and differing from each other on the adjacent side, and similar to the fourth embodiment, the narrow region of different width in the side direction of the first side and the opposing side is arranged, and the external connection region is arranged in the narrow region of wide width. The face opposing the adjacent element is made to wide width by the first side forming the long side, and suitable light reflection by the adjacent element can be realized.

Furthermore, as shown in FIGS. 10A and 11A, in the case of the semiconductor light emitting element of rectangular shape in plan view, the first side facing the other element is made longer than the second side, so that stronger light can be exited from the first side, and the area of the end face facing the adjacent element is made wider, whereby stronger light can be reflected at the opposing end faces and retrieved, and thus is preferable. As shown in FIG. 11A, in the case that the narrow region 6 on the first side 11 is non-symmetric with the perpendicular bisector of the side 11 as the axis, if one element is rotated 180 degrees and arranged, the end face of weak light emission intensity and the end face of strong light emission intensity can be faced to each other, and bias of light emission distribution can be alleviated.

Figure 10B:
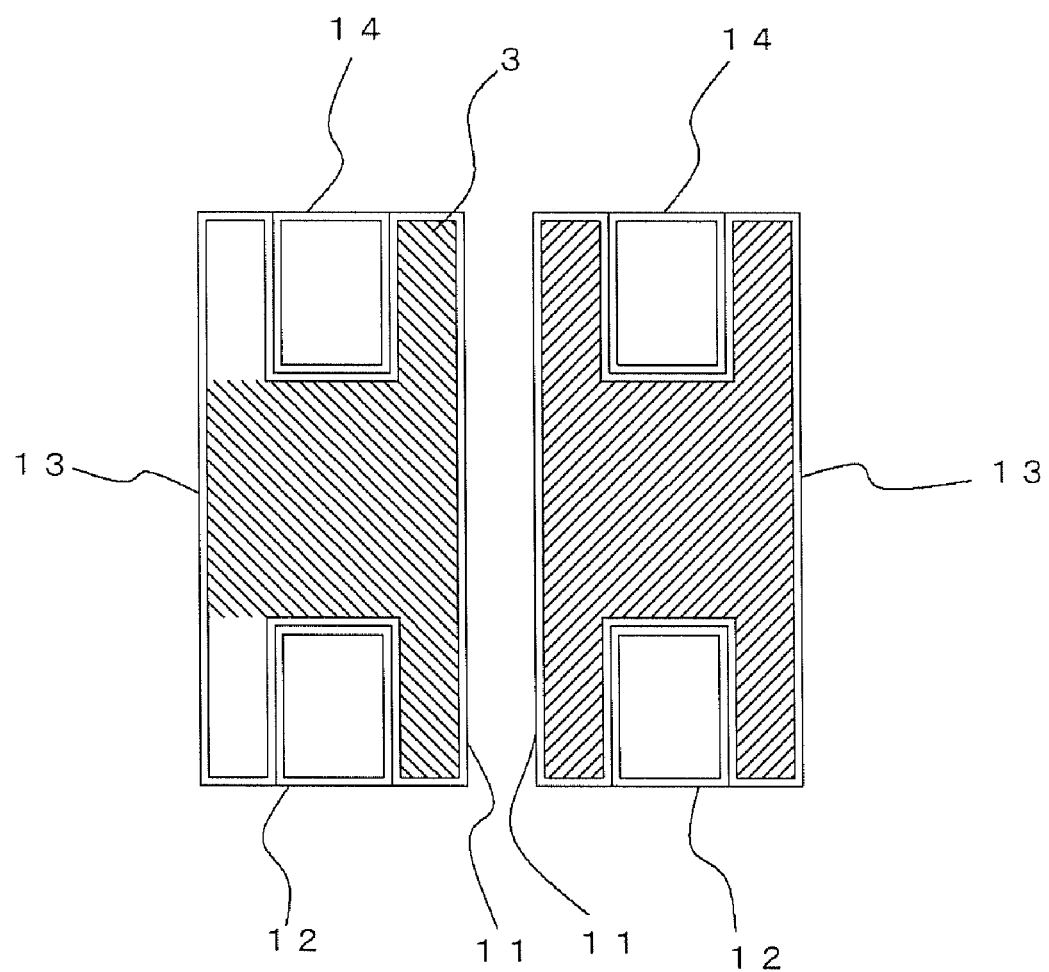
FIG. 10B is a schematic plan view showing regions of area $R_1$ and $R_2$ of a light emitting element according to the seventh embodiment of the present invention.
Figure 11B:
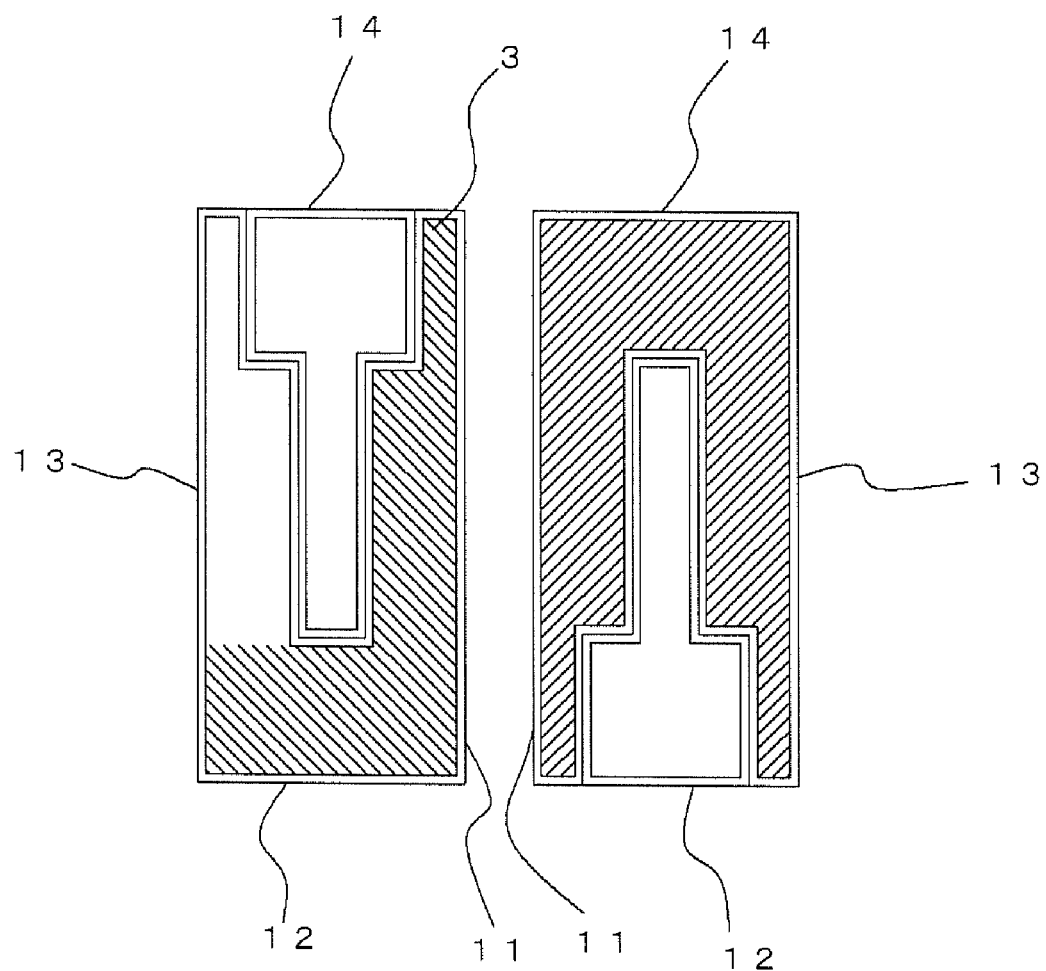
FIG. 11B is a schematic plan view showing regions of area $R_1$ and $R_2$ of a light emitting element according to the seventh embodiment of the present invention.

In the element of FIGS. 10A and 11A, the first side 11 and the second side 12 face the first semiconductor layer exposure part 2 on each side and each opposing side when seen in the direction of the opposing side of each side, wherein the areas R1, R2 of the second electrode 3 of the relevant region are shown in FIGS. 10B and 11B, respectively. The area of the region indicated by downward-sloping diagonal lines in the element on the left side is R1, and the area of the region indicated by upward-sloping diagonal lines in the element on the right side is R2, wherein the proportion of each region occupying the area of the entire element is R1 of about 51% and R2 of about 63% in FIG. 10B, and R1 of about 51% and R2 of about 58% in FIG. 11B. In the ratio of the length of the first side 11 and the length of the second side 12 in the element of FIG. 10B is equal to the ratio in the element of FIG. 10B, and is about 2:1, and thus the element of FIG. 10B has R1/L1 of about 26, R2/L2 of about 63, and the element of FIG. 11B has R1/L1 of about 26, and R2/L2 of about 58, and thus in either case, R1/L1 is smaller than R2/L2.

[Other Configurations and Modes According to an Embodiment of the Present Invention]

Each configuration in each embodiment will be described in detail below.

(Second Semiconductor Layer, First Semiconductor Layer)

The first and the second semiconductor layer include that using GaN and other semiconductors. If the semiconductor light emitting element is covered with fluorescent substance, the nitride semiconductor ($In_XAl_YGa_{1-X-Y}N$, $0 \leq X$, $0 \leq Y$, $X+Y \leq 1$) capable of light emitting short wavelength for efficiently exciting the fluorescent substance is suitably used. The structure of the semiconductor layer includes homo-structure including MIS junction, PIN junction, and pn junction, hetero-structure, and double hetero-structure. Various light emission wavelengths can be selected depending on the material and the molar fraction of the semiconductor layer. A structure including a single quantum well structure or multiple quantum well structure in which the semiconductor active layer is formed to a thin film for producing the quantum effect is formed between the second semiconductor layer and the first semiconductor layer of the light emitting region. When the nitride semiconductor is used, materials such as sapphire, spinel, SiC, Si, ZnO and the like are suitably used for the growth substrate of the semiconductor layer, and sapphire substrate is preferably used to form the nitride semiconductor having satisfactory crystallinity with satisfactory mass productivity.

The semiconductor layer of first conductive type is exposed by removing one part of the semiconductor layer of second conductive type, the region in which the semiconductor layer of first conductive type that does not contribute to a light emission of the light emitting element is exposed is reduced and the region of the semiconductor layer of second conductive type is relatively increased to enhance the light retrieving efficiency of the light emitting element. The light emitting layer arranged between the semiconductor layers of the first and the second conductive-type is preferably exposed on the first side, so that the attenuation of the light exited from the first side can be suppressed.

(Second Electrode, First Electrode)

The second electrode is typically arranged on the semiconductor layer of second conductive type as a current diffusion electrode for spreading the current into the light emitting element to the entire surface of the semiconductor layer of the second conductive type. The second electrode is preferably arranged over substantially the entire surface of the semiconductor layer of the second conductive type. In particular, if the semiconductor layer of the second conductive type is p-type layer, the current is less likely to spread towards the in-plane direction, and thus such structure is preferable. For example, p-type GaN layer may be used as the semiconductor layer of the second conductive type which the second electrode is formed on, and a resistance of the p-type GaN layer is generally 0.1 Ω·mm to 10 Ω·mm. A second conductive type layer side seat electrode connecting to the conductive member such as a bump may be arranged on the second electrode. The first electrode is arranged as the seat electrode connecting with the conductive member such as a bump at the surface of the semiconductor layer of first conductive type.

The formation of the second electrode and the first electrode is performed through evaporation method or sputtering method after exposing the semiconductor layer of first conductive type through methods such as etching. In the present embodiment, the second electrode is preferably made of material for reflecting the light from the light emitting element towards the transparent substrate of the light emitting element. For instance, the material may be Ag, Al, Rh, Rh/Ir and the like. In addition, an oxide conductive film such as ITO (complex oxide of indium (In) and tin (Sn)) and ZnO, metal thin film such as Ni/Au, and the like may be formed as the transparent electrode on the entire surface of the p-type semiconductor layer. The second electrode is formed to a thickness of an extent capable of light emitting the element at the portion of narrow width such as the narrow region, and a film thickness of about 100 nm to 1 µm is selected.

(Semiconductor Light Emitting Element)

The semiconductor light emitting element according to an embodiment of the present invention is arranged in at least the light emission device and has a first side facing each other between the elements adjacent to each other, where an element having a curve at one part such as one side and the other sides have a semicircle is obtained, but is suitably a polygonal, and is preferably a polygonal including at least two sides of the first side and the opposing side thereof, three sides of the first side and the adjacent sides thereof, and more preferably, including all four sides, and furthermore a quadrilateral such as a parallelogram and trapezoid. The preferred quadrilateral specifically includes that having rectangular shape such as a square or a rectangle in plan view. The first side facing the other element is preferably a side of the same length in the case of square, or a long side in the case of rectangle, compared to the other sides in particular to the adjacent side, whereby the end face capable of reflecting the light from the adjacent element can be enlarged, and the effects according to the embodiment of the present invention can be easily obtained. A mode in which the length of each first side differs and a mode in which only one part of the side faces may be adopted between the adjacent elements, and a mode in which the entire long sides of the same length face each other is suitably adopted so that suitable reflection by the adjacent element is preferably performed. Furthermore, the first side of the adjacent elements may be faced inclined in a direction crossing each other, but is preferably substantially parallel to each other since the light emission thereof becomes strong due to light reflecting in the inclined direction and the directivity worsens.

Regarding the dimension of the light emitting element according to the embodiment of the present invention, since the desired second electrode and the light emitting region having the narrow region and the extending part or the above described each region are arranged on the first side, the light emitting element needs the area of the structure part, specifically, greater than or equal to 300 µm. Furthermore, a larger area is required to arrange the structure of the desired second electrode and the light emitting region such as the extending part, the narrow region, the first electrode region and the second electrode on the outer side and the inner side of the element on the first side and the opposing side or the adjacent side. Specifically, the area is preferably greater than or equal to 600 µm, where the upper limit is normally selected to about a few mm. The distance between a plurality of semiconductor light emitting elements is made small to efficiently reflect the light between the opposing end faces, and is specifically preferably smaller than or equal to about 200 µm. The distance may be smaller than or equal to the length of the first side or smaller than or equal to 20% of the length of the first side. The lower limit is determined by the mounting precision of the element and may be greater than or equal to a few dozen µm.

The growth substrate may be a transparent substrate made of sapphire etc., so that the light can be retrieved from the growth substrate. The light from the growth substrate surface of the light emitting element is easily retrieved by thinning the thickness of the growth substrate through polishing etc. Since the thickness of the semiconductor layer stacked on the growth substrate is generally thin or about a few µm, the growth substrate is preferably left at a thickness of greater than or equal to at least the semiconductor layer, and is preferably in the range of between about 10 µm and about 500 µm, and more preferably between about 50 µm and about 200 µm.

(Supporting Substrate)

The conductor wiring is formed on the surface facing the electrode of the light emitting element in the supporting substrate according to the present embodiment, and a member for fixing or supporting the flip-chip mounted light emitting element can be used. Furthermore, when conducting the supporting substrate to the lead electrode, the conductor wiring is formed by the conductive member from the surface facing the light emitting element to the surface facing the lead electrode. The material of the supporting substrate has substantially the same coefficient of thermal expansion as the light emitting element, and is preferably aluminum nitride with respect to the nitride semiconductor light emitting element, so that the influence of thermal stress generated between the supporting substrate and the light emitting element can be alleviated. Alternatively, inexpensive silicon providing a function of electrostatic protective element may be used. In addition, a print substrate arranged with a circuit to be connected with a plurality of elements, a mounting base member etc. at the window part or the concave part of the light emission device and the like may be used.

(Conductor Wiring)

The metal serving as the material of the conductor wiring includes Au or Al which is a silver white metal. When the silver white metal having high reflectivity is used, the light from the light emitting element is reflected in the direction opposite to the supporting substrate, and is thus preferable since the light retrieving efficiency of the light emission device enhances. The metal serving as the material of the conductor wiring is preferably selected in view of the adherence between the metals or a so-called wettability. For instance, the conductor wiring is Au or an alloy containing Au when joining with the electrode containing Au of the LED chip by ultrasonic die bond through the Au bump.

Figure 3:
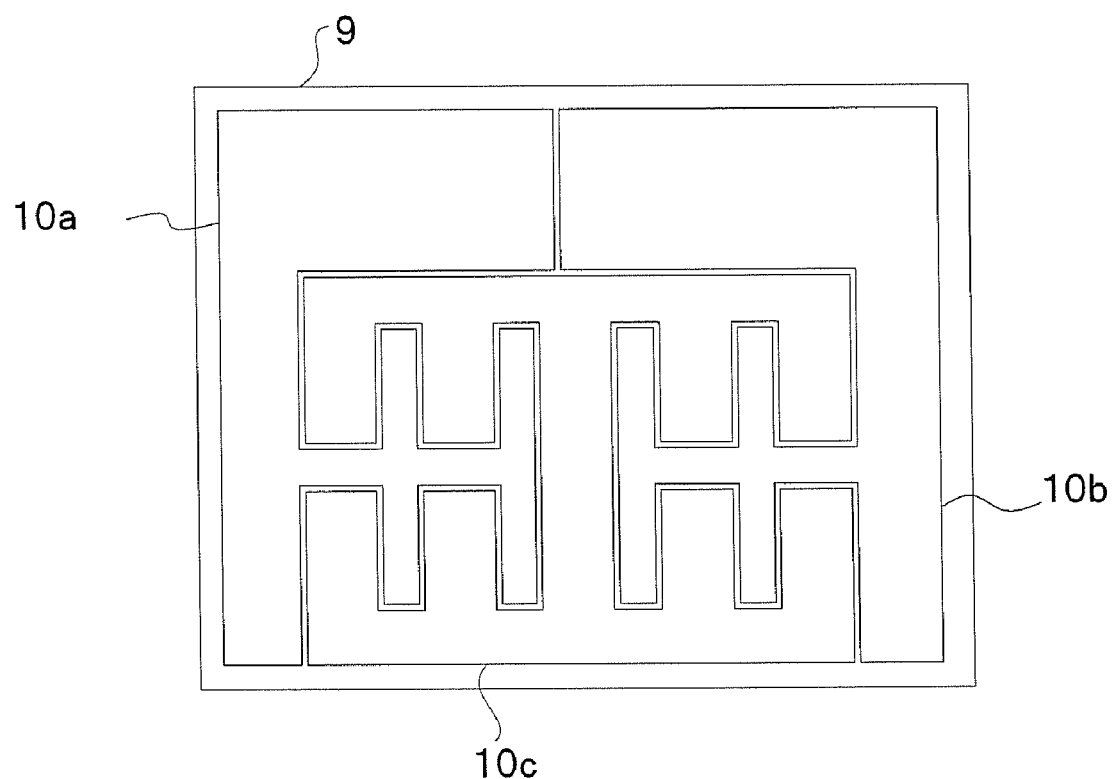
FIG. 3 is a schematic plan view showing a supporting substrate according to the first embodiment of the present invention.

FIG. 3 shows a pattern of the conductor wirings 10a to 10c in the light emission device of FIG. 2A. In the supporting substrate 9 shown in FIGS. 2A and 3, the first conductor wiring 10a is arranged at a position facing the second electrode 3 of one light emitting element, and similarly, the second conductor wiring 10b is arranged in a region facing the first electrode 4 of the other light emitting element. Furthermore, a third conductor wiring 10c for electrically connecting the first electrode 4 of one light emitting element and the second electrode 3 of the other light emitting element is arranged, so that the elements connected in series. Each element has the end of the semiconductor layer exposed from the light shield member such as an electrode to be able to exit light, where one part of the second conductor wiring 10b and the third conductor wiring 10c to be joined with the first electrode 4 of each element is arranged in an extending manner at the surface of the supporting substrate facing the relevant end. Accordingly, as shown in FIG. 4, the light leaked from the region between the first and second electrodes can be reflected by the conductor wiring in plan view, and in particular, the light flux of the light emission device can be further enhanced by the wiring extending to the outer side of the element at the outer edge of the element as shown in FIG. 2A. In particular, when using a material that tends to absorb light from the light emitting element such as aluminum nitride as the material of the supporting substrate, high effect is obtained. The conductor wiring is preferably arranged to cover between the two elements.

As shown in FIG. 2A, the pattern of the conductor wiring connecting to the first electrode 4 is arranged to match the pattern of the second electrode 3, specifically, a configuration in which the second electrode mainly overlaps the conductor wiring at the second electrode adjacent to the first electrode at the inner side of the element in plan view and each end substantially matches is preferably adopted. When an element in which the end face of the light emitting layer between the exposure part of the first semiconductor layer and the second semiconductor layer arranged with the second electrode is exposed is used, the wiring electrode is preferably arranged at least under the exposure part of the end face of the light emitting layer in plan view. Thus, as shown in FIG. 4, the light leaked from between the second electrode 3 and the first electrode 4 is reflected by the conductor wiring connecting to the first electrode 4 and the area of the conductor wiring connecting to the second electrode 3 is increased by the wiring arranged extending from the end of the first electrode. At this point, the conductor wiring is preferably arranged extending to the outer side in the adjacent second electrode direction from the end of the first electrode in plan view.

In FIG. 2A, the conductor wiring arranged in correspondence to the semiconductor layer exposure part of each element is a conductor wiring connecting with the first electrode, but may be a conductor wiring connecting with the second electrode. If the area of the first electrode is smaller than the second electrode as in the element shown in FIG. 1, the conductor wiring connecting with the second electrode is extended up to the position corresponding to the semiconductor exposure part, whereby the area of the conductor wiring connecting with the first electrode becomes smaller, higher accuracy is required for the connection between the electrode and the conductor wiring, and great amount of light reaches the conductor wiring of the first electrode in the outward direction from the end of the light emitting region as shown in FIG. 4, and thus the pattern shown in FIG. 2A is preferable.

(Light Emission Device)

In the light emission device of the present embodiment, a plurality of semiconductor light emitting elements is mounted on the supporting substrate, and each element is arranged so that the first side faces substantially parallel to each other. The light can be thus efficiently reflected between the opposing end faces of the plurality of elements, and the light retrieving efficiency of the light emission device can be enhanced. Furthermore, the light emission device shown in FIG. 2A has two light emitting elements connected in series but may have the two light emitting elements connected in parallel. In parallel connection, the conductor wiring is simplified and the heat radiation characteristic can be enhanced compared to the series connection. The light emission device according to the embodiment of the present invention may have each element flip-chip mounted or face-up mounted with the electrode forming surface side as the light emitting surface side and the opposing surface side as the mounting surface side. In particular, flip-chip mounting is preferable, and flip-chip mounting of retrieving the light from the growth substrate side is adopted, so that the proportion of the light exited from the end face of the substrate and the element is greater than in the face-up mounting, and the reflection by the adjacent element can be suitably used.

In each example described above, a case of arranging a plurality of semiconductor light emitting elements having the same light emitting region shape has been described. The portion in which the intensity of the exited light is the same extent can be faced to each other, and the length of the first side is the same, and thus light is efficiently reflected between the opposing end faces. The light emitting elements in which the shape of the second electrode or the size of the element differs may be arranged side by side, in which case as well, the first side of each element is arranged in a line form so as to face each substantially in parallel.

In the present embodiment, the conductive member for joining the electrode of the semiconductor light emitting element and the conductor wiring of the supporting substrate includes metal material called bump. The gap formed between the mounted light emitting elements can be sealed by a transparent resin layer. The material of the resin layer includes silicon resin, epoxy resin, or the like. The resin layer for sealing between the elements is preferably optically connected in a continuing manner so as to bridge between the elements. If an interface between the resin layer and another member exists between the elements, the light exited from the end face of one element is refracted or reflected at the interface of the resin layer, and is less likely to reach the end face of the other adjacent element. The resin layer for sealing the elements and the upper surface of the element may be also a wavelength conversion member by containing phosphor. The wavelength conversion member contains a phosphor for absorbing at least one part of the light from the light emitting element and emitting light having different wavelengths.

Example 1

Figure 12A:
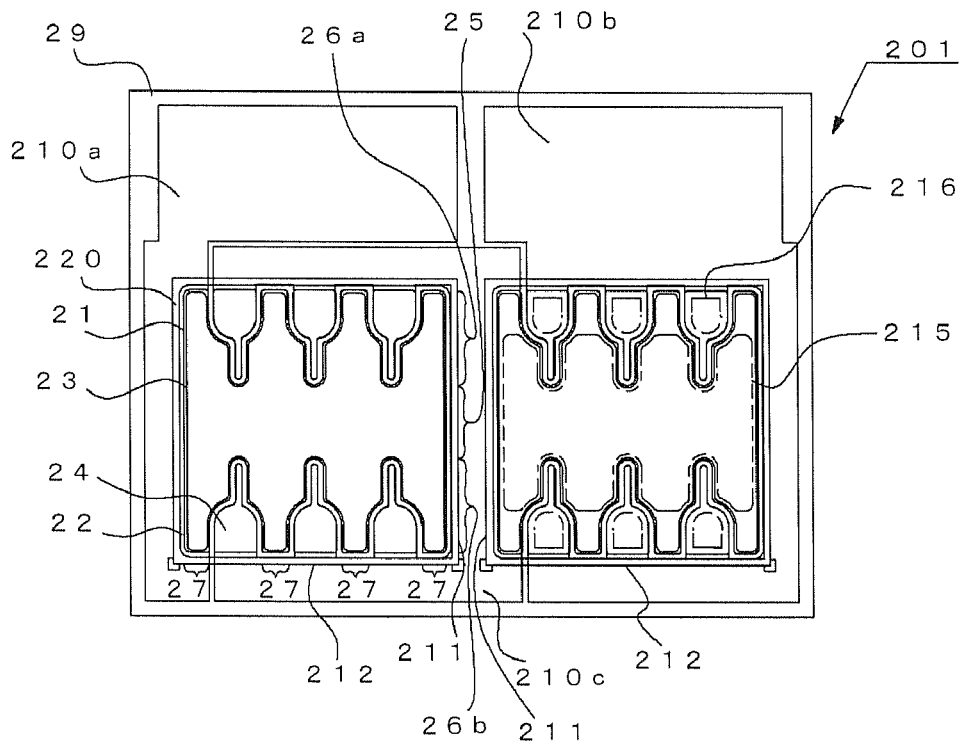
FIG. 12A is a schematic plan view showing the outer appearance of an upper surface of a light emission device according to example 1 of the embodiment of the present invention.

A light emission device according to the present example is shown in FIG. 12A. The light emission device 201 according to the present example has two semiconductor light emitting elements of the same structure flip-chip mounted in line form by a bump on the same supporting substrate 29. Each element is connected to the conductor wirings 210a to 210c of the surface of the supporting substrate 29 so that the first side 211 faces each other substantially in parallel. As shown in FIG. 12A, the external connection region 215 of the second electrode and the external connection region 216 of the first electrode in one element are connected to different conductor wirings.

Figure 12B:
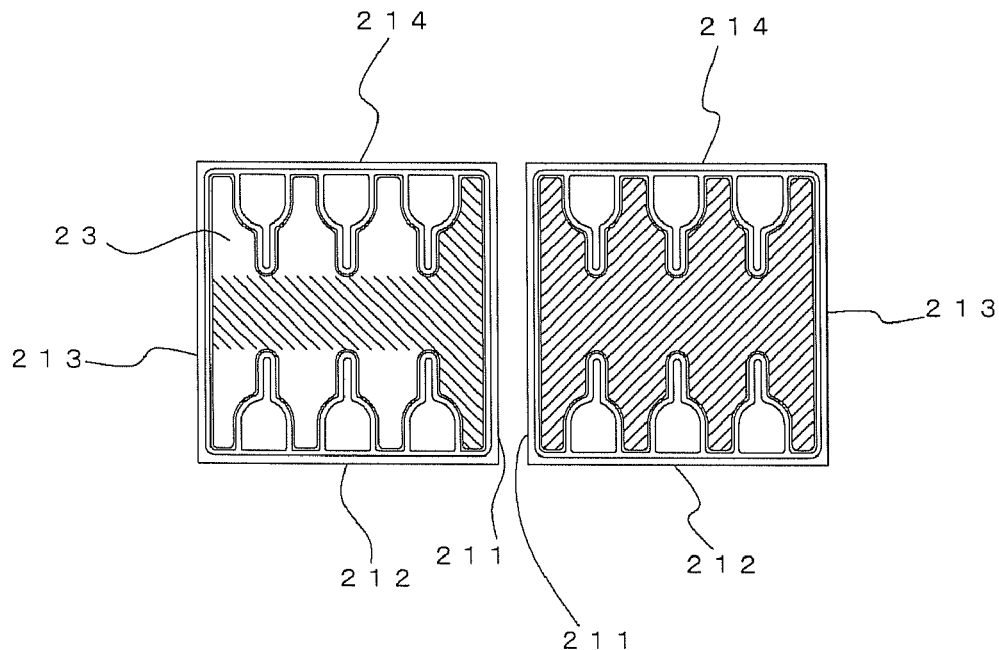
FIG. 12B is a schematic plan view showing regions of area $R_1$ and $R_2$ of a light emitting element according to example 1 of the embodiment of the present invention.

The light emitting element according to the present example is a substantially square element in plan view in which each side is about 1 mm, in which a light emitting region 21 with a stacked structure of the n-type semiconductor layer and the p-type semiconductor layer is arranged on the transparent substrate 220 for the semiconductor layer growth, and the p electrode 23 serving as the second electrode is arranged on the p-type semiconductor layer surface and the n electrode 24 serving as the first electrode is arranged on the surface of the exposure part 22 including the n-type semiconductor layer exposed from the p-type semiconductor layer. The p electrode 23 includes narrow regions 26a and 26b and the extending part 25 on the first side 211 of the element, where the length in the side direction of the first side 211 is about 330 μm each for the narrow regions 26a, 26b, or a total of about 660 μm, and about 244 μm for the extending part 25, whereby the length of the narrow regions 26a, 26b is longer than the length of the extending part 25. As shown in FIG. 12B, $R_2$ indicated by downward-sloping diagonal lines in the element on the right side is equal to the area of the entire light emitting region, and thus $R_1$ indicated by upward-sloping diagonal lines in the element on the left side is smaller than $R_2$. Specifically, R/L in the first side 211 and the opposing side 213 is about 0.29 mm$^2$/mm each, and R/L in the second side 212 and the opposing side 214 is about 0.41 mm$^2$/mm each.

Only the extending part 27 is arranged on the second side 212 adjacent to the first side 211. The ratio S/L of the area S of the region sandwiched by one side and the opposing side of the relevant one side or the light emitting region arranged closer to the relevant one side than the opposing side and the length L of the relevant one side is about 0.12 mm$^2$/mm each for the first side 211 and the opposing side 213, and about 0.24 mm$^2$/mm each for the second side 212 and the opposing side 214. The set of the first side 211 and the opposing side 213 is smaller than the set of the second side 212 and the opposing side 214, that is, the light emitting region 21 has the set of the first side 211 closer than the set of the second side 212. The shape in plan view of each semiconductor layer and the electrode of the present example is rotation symmetric by 180 degrees with the center of the square of the element as the axis, and is line symmetric with the center line parallel to the first side or the second side as the symmetric axis. The distance between the two elements is about 100 μm.

The light emitting element in the present example uses a nitride semiconductor light emitting element having In0.3Ga0.7N semiconductor as an active layer and a dominant wavelength of 455 nm. The light emitting element is formed by forming a nitride semiconductor with MOCVD method on a sapphire substrate, an n-type nitride semiconductor layer doped with Si, an active layer of multi-quantum well structure in which a plurality of sets each including a GaN layer as a barrier layer and an InGaN layer as a well layer, and a p-type nitride semiconductor doped with Mg are sequentially stacked on the sapphire substrate through a buffer layer.

In the light emitting element of the present example, one part of the p-type nitride semiconductor layer, the active layer, and the n-type nitride semiconductor layer is removed by etching, the surface of the n-type nitride semiconductor layer is exposed, and each surface of the p-type nitride semiconductor layer and the n-type nitride semiconductor layer are exposed on the same surface side of the nitride semiconductor. The outer peripheral portion of the element has each semiconductor layer removed and the surface of the transparent substrate exposed. The p electrode 23 having Ni, Ag, Ti, and Pt as the material is arranged on substantially the entire surface of the p-type nitride semiconductor layer surface. According to such electrode, the current flowing through the p electrode 23 spreads over a wide range to the p-type contact layer, and the light emitting efficiency of the semiconductor light emitting element can be enhanced. The p electrode serves as the reflected electrode, so that the light from the light emitting element can be reflected at the p electrode and exited from the sapphire substrate side, and the light retrieving efficiency from the flip-chip mounted light emitting element can be enhanced. Furthermore, a p-side seat electrode having Au, Rh, Pt, and Ni as the material is arranged on the surface of the p electrode 23, and an n electrode 24 having Al—Si—Cu alloy, W, Pt, Au, and Ni as the material is arranged on the surface of the n-type nitride semiconductor layer 22. The p-side seat electrode and the n electrode are the same material and are simultaneously formed, so that the number of processing for forming the electrode can be also reduced. Furthermore, an insulative protective film including silicon oxide is formed so as to cover the surface of each electrode and the semiconductor layer. The protective film has an opening portion at a bump joining position of the p electrode and the n electrode.

As shown in FIG. 12A, the supporting substrate 29 used in the present example is formed with the conductor wirings 210a to 210c having Au as the material on the aluminum nitride plate, and the p electrode 23 and the n electrode 24 of the light emitting element are joined through the Au bump. The area of the region of the conductor wiring facing the p electrode 23 of the light emitting element is larger than the area of the region facing the n electrode 24. The light emitting element according to the present example has two elements connected in series. The area of the region of the conductor wiring facing the positive electrode of the light emitting element is greater than the region facing the negative electrode of the light emitting region, and the number of bumps to be placed is also larger. The conductor wiring shown in FIG. 12A is arranged with a first conductor wiring 210a corresponding to the p electrode 23 of one light emitting element, a second conductor wiring 210b corresponding to the n electrode 24 of the other light emitting element, and a third conductor wiring 210c for electrically connecting the n electrode 24 of one element and the p electrode 23 of another element and connecting the elements in series. Silicon resin containing YAG-based phosphor as the wavelength conversion member is screen-printed to cover the light emitting element. The wavelength conversion member covers the upper surface and the side surface of the light emitting element and is also filled between the two elements. The supporting substrate is mounted on a package and connected to the external electrode by way of a conductive wire.

Figure 13:
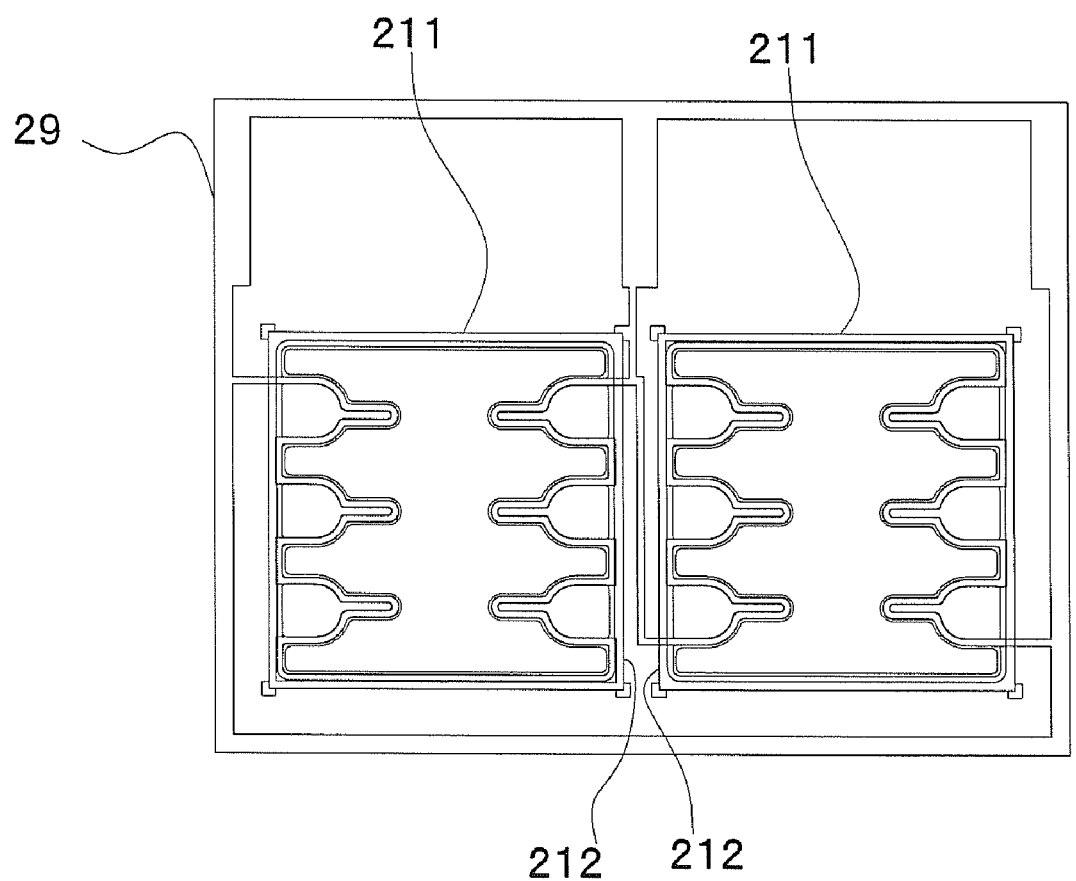
FIG. 13 is a schematic plan view showing the outer appearance of an upper surface of a light emission device according to comparative example 1.

As comparative example 1, as shown in FIG. 13, light emission device is manufactured similar to example 1 except that the semiconductor light emitting element is arranged such that the second side 212 faces each other. The light flux of the light emission device according to example 1 and comparative example 1 is 228.2 lumens in example 1, 220.7 lumens in comparative example 1 at a current of about 700 mA, whereby the light flux enhances by about 3.4% with the light emission device of example 1. Regarding the light emission intensity distribution, the light emission intensity between the opposing end faces of the light emitting element in example 1 is stronger than that in comparative example 1, where the light exited from the end face of the element can be efficiently reflected between the adjacent elements with the light emission device of the present example, and the light flux of the light emission device can be enhanced.

Example 2

Figure 14:
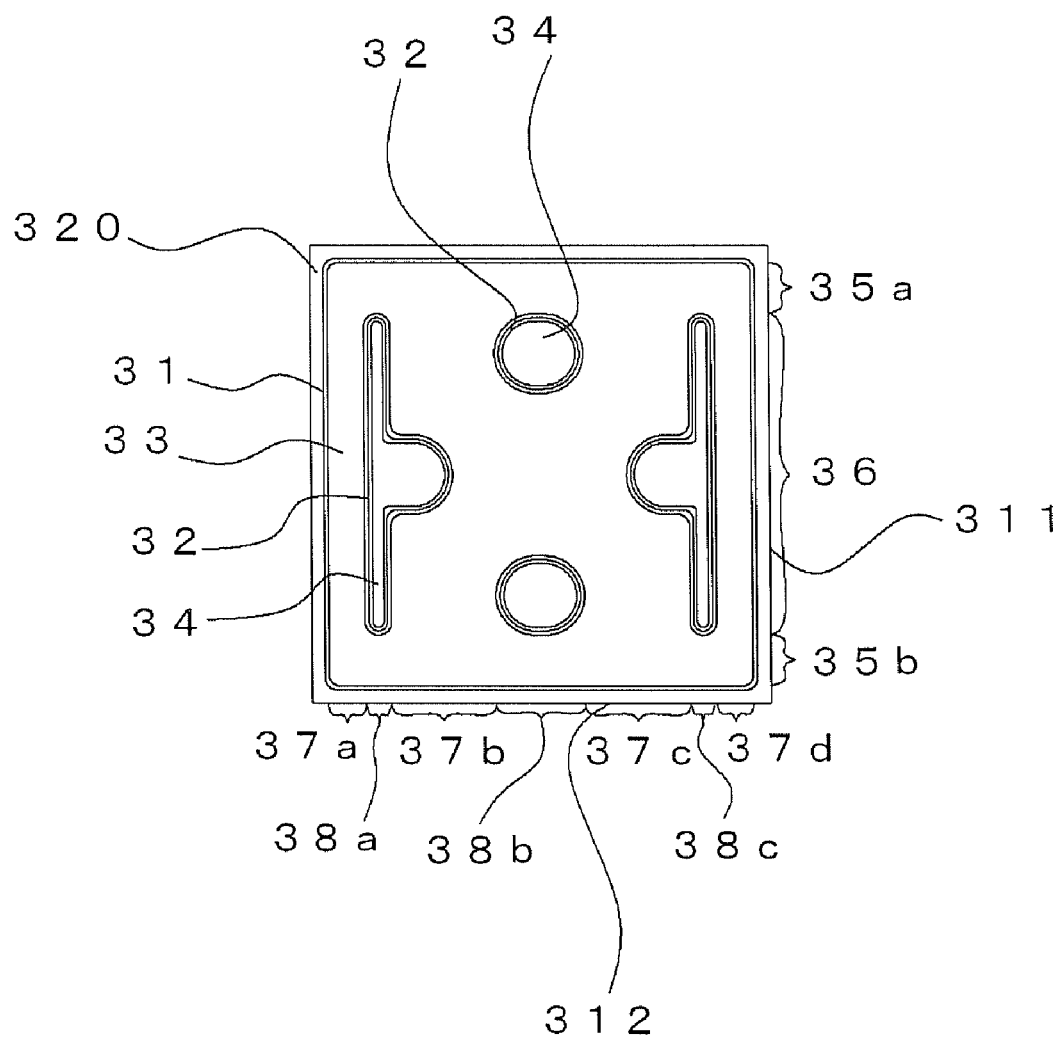
FIG. 14 is a schematic plan view showing a semiconductor light emitting element according to example 2 of the embodiment of the present invention.
Figure 15A:
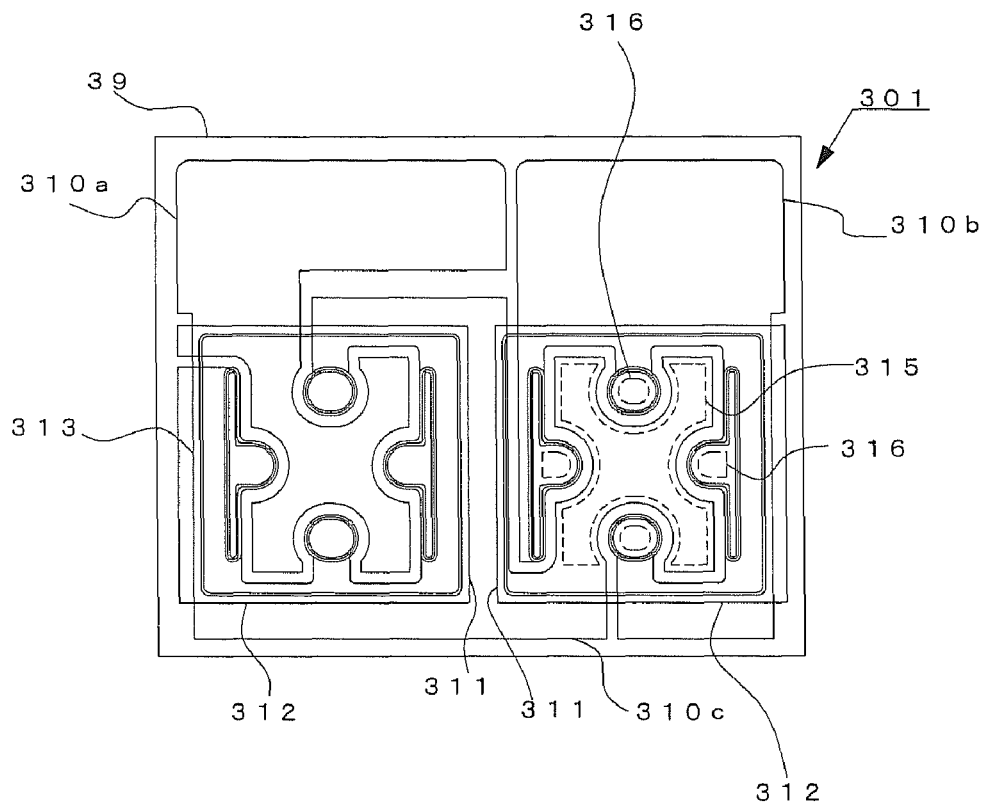
FIG. 15A is a schematic plan view showing the outer appearance of an upper surface of a light emission device according to example 2 of the embodiment of the present invention.

FIG. 14 is a schematic top view showing a semiconductor light emitting element according to example 2, and FIG. 15 is a top view schematically showing the outer appearance of the upper surface of the light emission device according to example 2. The light emission device 301 according to present example has two semiconductor light emitting elements of the same structure flip-chip mounted in line form on the conductor wirings 310a to 310c of the same supporting substrate 39, and differs from the light emission device of example 1 in the shape of the light emitting region of the semiconductor light emitting element to be mounted. The portion of the conductor wirings 310a to 310c connecting to the negative electrode is arranged extending to the position facing the end of the light emitting layer between the positive and negative electrodes of the light emitting element, where the end of the conductor wiring substantially matches the end on the n electrode 34 side of the p electrode 33. As shown in FIG. 15A, the external connection region 315 of the second electrode and the external connection region 316 of the first electrode of one element are connected to different conductor wirings.

The light emitting element of the present example shown in FIG. 14 is a substantially square element in plane view in which each side is about 1 mm, in which a light emitting region 31 with a stacked structure of the n-type semiconductor layer and the p-type semiconductor layer is arranged on the transparent substrate 320 for the semiconductor layer growth, and the p electrode 33 serving as the second electrode is arranged on the p-type semiconductor layer surface and the n electrode 34 serving as the first electrode is arranged on the surface of the exposure region 32 including the n-type semiconductor layer exposed from the p-type semiconductor layer. The p electrode 33 includes a narrow region 36 and the extending parts 35a, 35b on the first side 311 of the element, where the length in the side direction of the first side 311 is about 704 µm for the narrow region 36, and about 111 µm each for the extending part 35a, 35b, or a total of about 222 µm, whereby the length of the narrow region 36 is longer than the length of the extending parts 35a, 35b. The light emitting region 31 includes an opening portion, and the n electrode 34 is arranged at the surface of the exposure part 32 exposed in the opening portion.

Figure 15B:
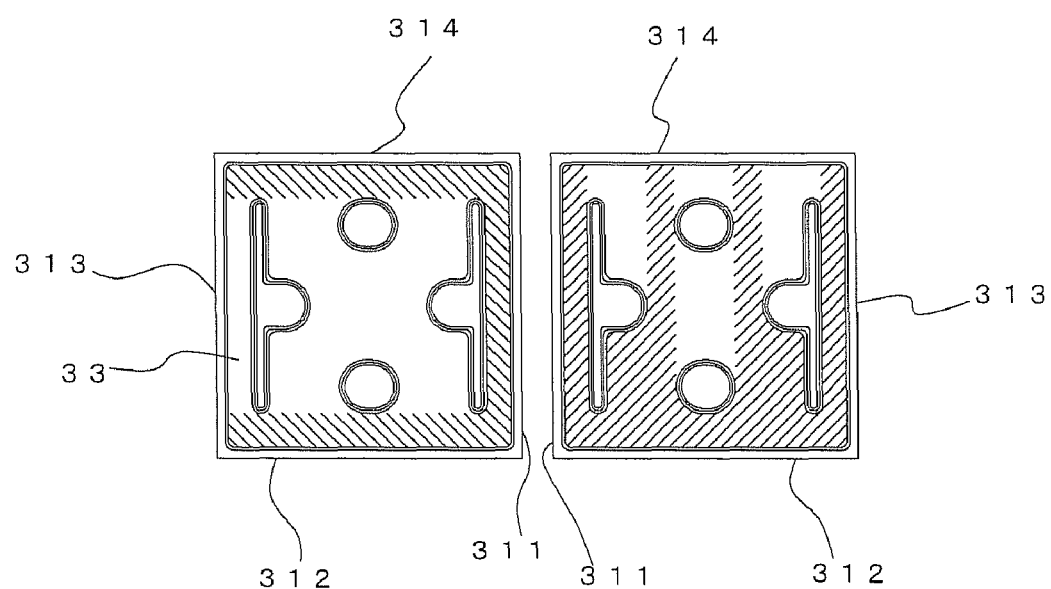
FIG. 15B is a schematic plan view showing regions of area $R_1$ and $R_2$ of the light emitting element according to example 2 of the embodiment of the present invention.

In addition to the extending parts 37a to 37d, the narrow regions 38a to 38c are arranged on the second side 312 adjacent to the first side 311. In the side direction of the second side 312, the length of the extending part 37a and 37d is each about 80 µm, the length of the extending part 37b and 37c is each 228 µm, the length of the narrow regions 38a and 38c is each about 58 µmm, and the length of the narrow region 38b is about 194 µm. Therefore, the length of the narrow regions 38a to 38c is a total of about 310 µm, and is smaller than the total of about 616 µm of the length of the extending parts 37a to 37d. As shown in FIG. 15B, R2 indicated by upward-sloping diagonal lines in the element on the right side is equal to the area of the entire light emitting region, and thus R1 indicated by the downward-sloping diagonal lines in the element on the left side is smaller than R2. Specifically, the ratio R/L at the first side 311 and the opposing side 313 is about 0.26 mm$^2$/mm, and R/L at the second side 312 and the opposing side 314 is about 0.43 mm$^2$/mm. S/L is substantially equal at about 0.082 mm$^2$/mm at all sides.

Figure 16:
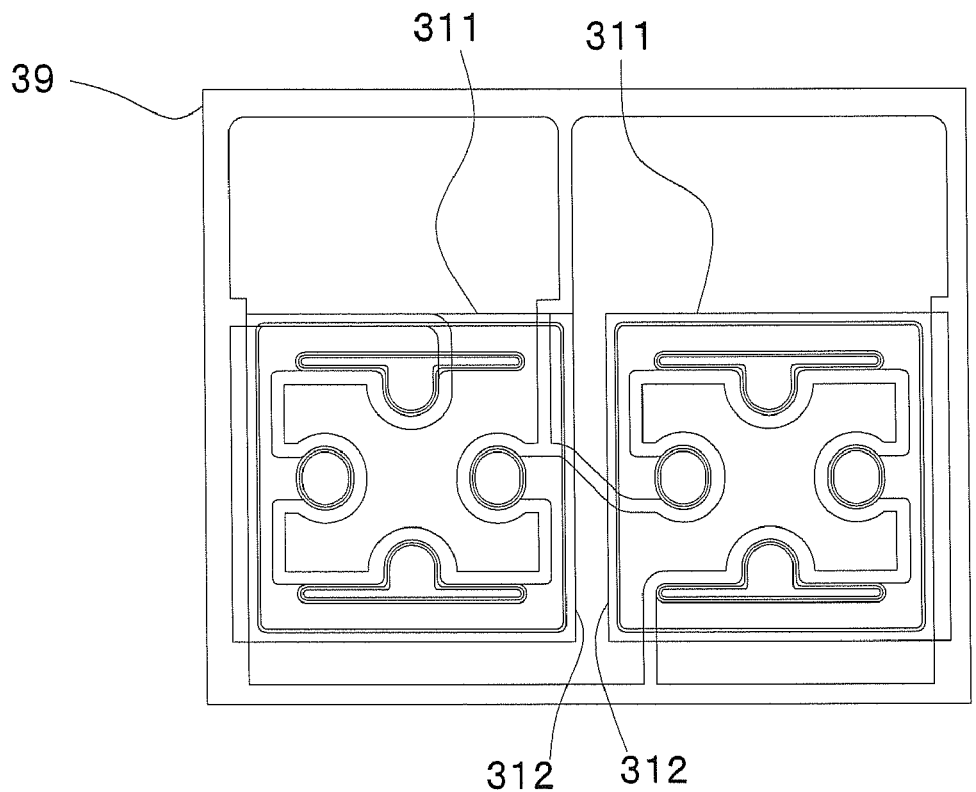
FIG. 16 is a schematic plan view showing the outer appearance of an upper surface of a light emission device according to comparative example 2.

As comparative example 2, as shown in FIG. 16, light emission device is manufactured similar to example 2 except that the semiconductor light emitting element is arranged such that the second side 312 faces each other. The light flux of the light emission device according to example 2 and comparative example 2 is 240.4 lumens in example 2, 235.6 lumens in comparative example 2 at a current of about 700 mA, whereby the light flux enhances by about 2% with the light emission device of example 2. The light flux of the light emission device can be enhanced with the light emission device of the present example.

Example 3

Figure 17:
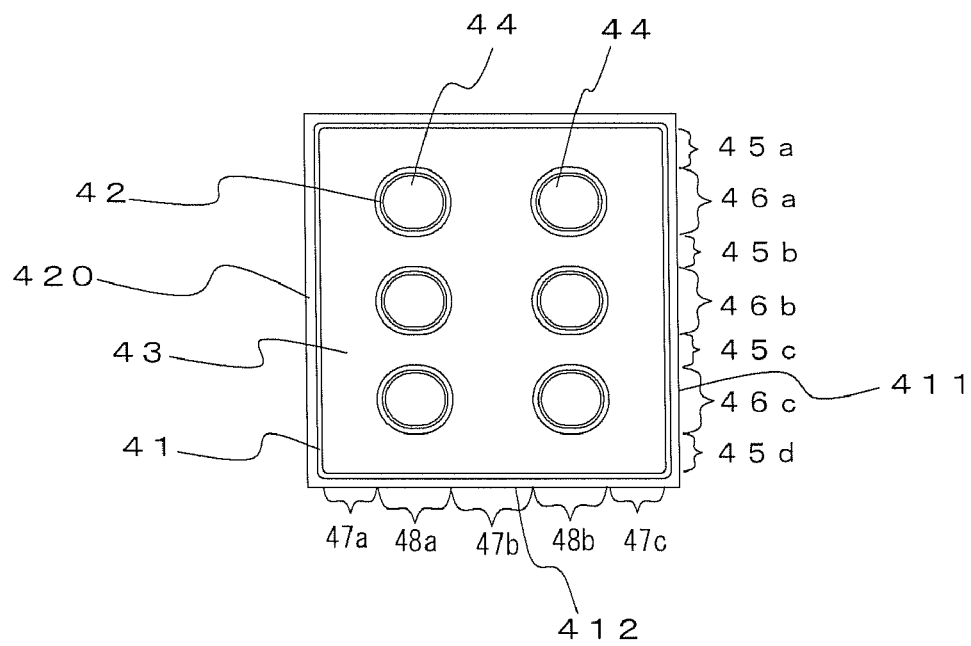
FIG. 17 is a schematic plan view showing a semiconductor light emitting element according to example 3 of the embodiment of the present invention.
Figure 18A:
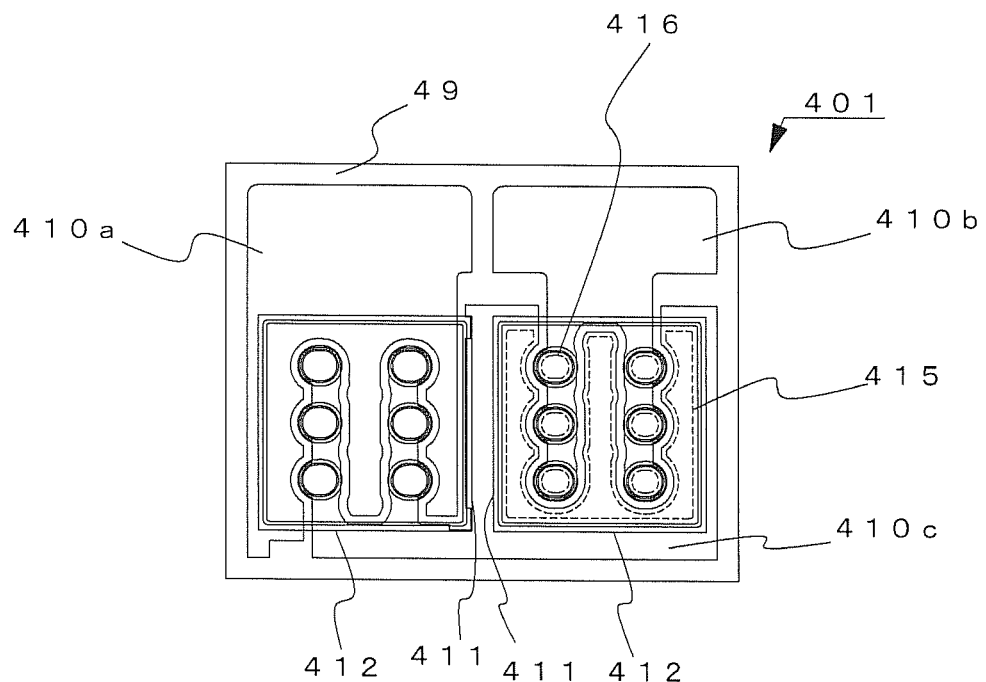
FIG. 18A is a schematic plan view showing the outer appearance of an upper surface of a light emission device according to example 3 of the embodiment of the present invention.

FIG. 17 is a schematic top view showing a semiconductor light emitting element according to example 3, and FIG. 18A is a top view schematically showing the outer appearance of the upper surface of the light emission device according to example 3. The light emission device 401 according to present example has two semiconductor light emitting elements of the same structure flip-chip mounted in line form on the conductor wirings 410a to 410c of the same supporting substrate 49, and differs from the light emission device of examples 1 and 2 in the shape of the light emitting region of the semiconductor light emitting element to be mounted. Similar to example 2, the portion of the conductor wirings 410a to 410c connecting to the negative electrode is arranged extending to the position facing the end of the light emitting layer between the positive and negative electrodes of the light emitting element, where the end of the conductor wiring substantially matches the end on the n electrode 44 side of the p electrode 43. As shown in FIG. 18A, the external connection region 415 of the second electrode and the external connection region 416 of the first electrode of one element are connected to different conductor wirings.

The light emitting element of the present example shown in FIG. 17 is a substantially square element in plane view in which each side is about 1 mm, in which a light emitting region 41 with a stacked structure of the n-type semiconductor layer and the p-type semiconductor layer is arranged on the transparent substrate 420 for the semiconductor layer growth, and the p electrode 43 serving as the second electrode is arranged on the p-type semiconductor layer surface and the n electrode 44 serving as the first electrode is arranged on the surface of the exposure part 42 including the n-type semiconductor layer exposed from the p-type semiconductor layer. The p electrode 43 includes narrow regions 46a to 46c and the extending parts 45a to 45d on the first side 411 of the element, where the length in the side direction of the first side 411 is about 552 μm in total for the narrow regions 46a to 46c, and about 372 μm in total for the extending parts 45a to 45d, whereby the length of the narrow regions 46a to 46c is longer than the length of the extending parts 45a to 45d. The light emitting region 41 includes an opening portion, and the n electrode 44 is arranged at the surface of the exposure part 42 exposed in the opening portion.

Figure 18B:
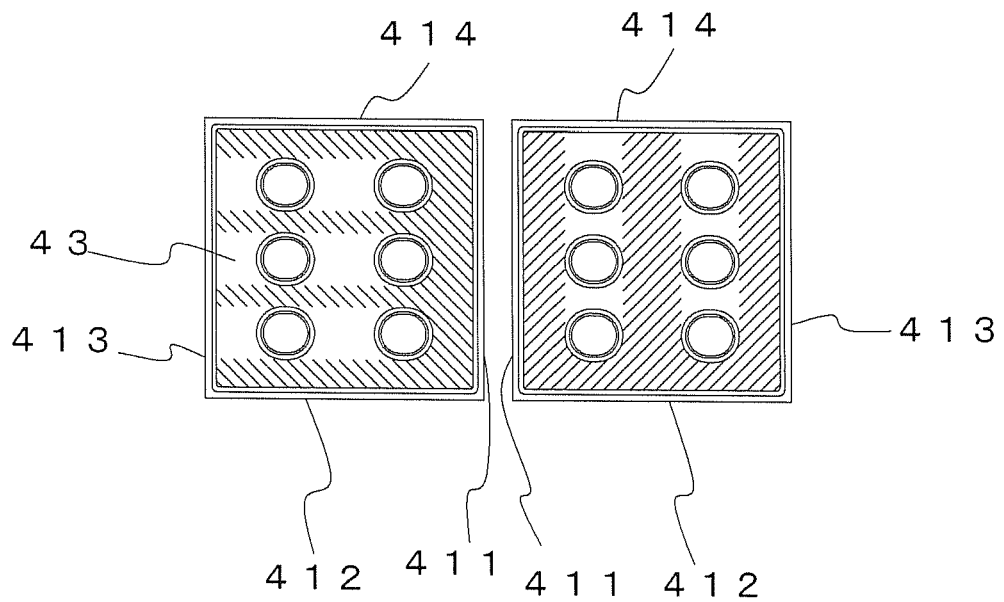
FIG. 18B is a schematic plan view showing regions of area $R_1$ and $R_2$ of the light emitting element according to example 3 of the embodiment of the present invention.

The extending parts 47a to 47c and the narrow regions 48a and 48b are arranged on the second side 412. In the side direction of the second side 412, the total of the length of the narrow regions 48a and 48b is about 408 μm, which is smaller than the total of the length of the extending parts 47a to 47c being about 516 μm. As shown in FIG. 18B, R1 indicated by the downward-sloping diagonal lines in the element on the left side is smaller than R2 indicated by upward-sloping diagonal lines in the element on the right side. Specifically, the ratio R/L at the first side 411 and the opposing side 413 is each about 0.42 mm²/mm, and R/L at the second side 412 and the opposing side 414 is each about 0.51 mm²/mm. S/L is substantially equal at about 0.071 mm²/mm at all sides. When two of the light emission devices according to example 3 are arranged side by side, that is, when four light emitting elements area are arranged on a line, the light flux of the light emission device is about 476.8 lumens at the current 650 mA.

Figure 19:
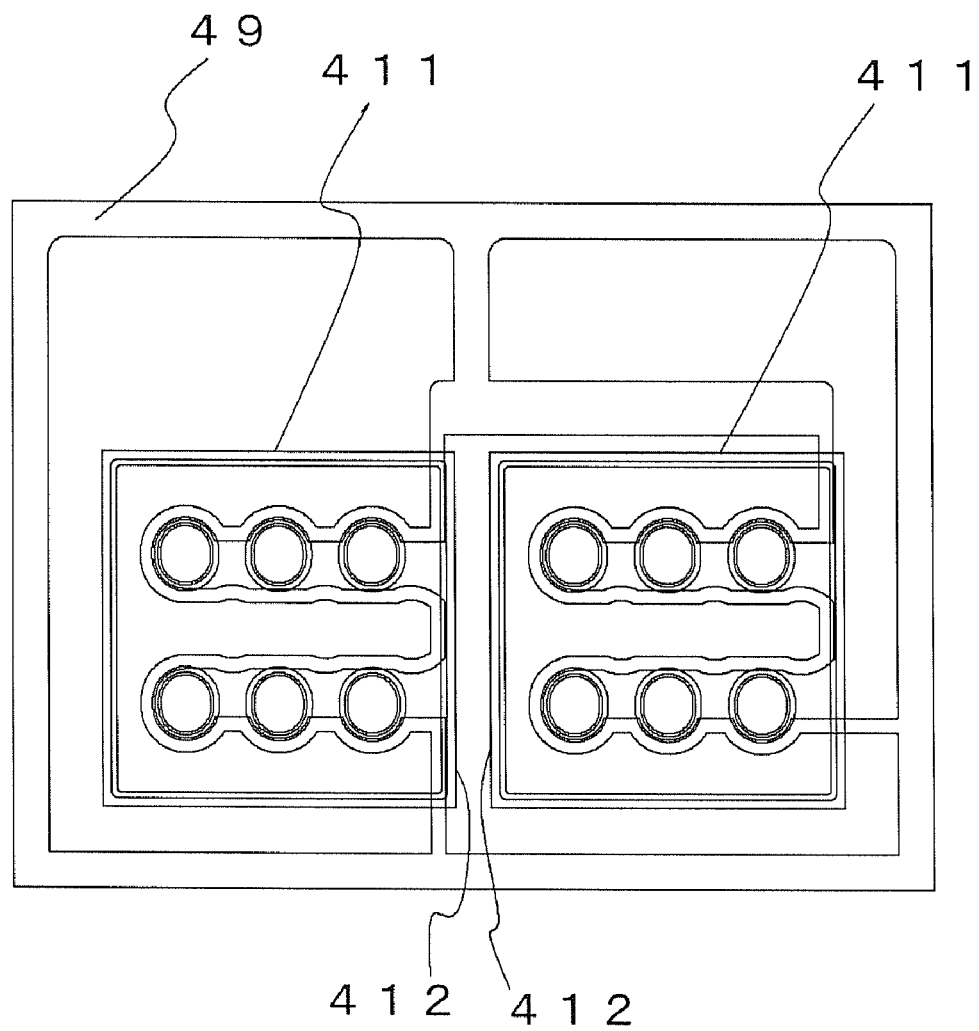
FIG. 19 is a schematic plan view showing the outer appearance of an upper surface of a light emission device according to comparative example 3.
Figure 20:
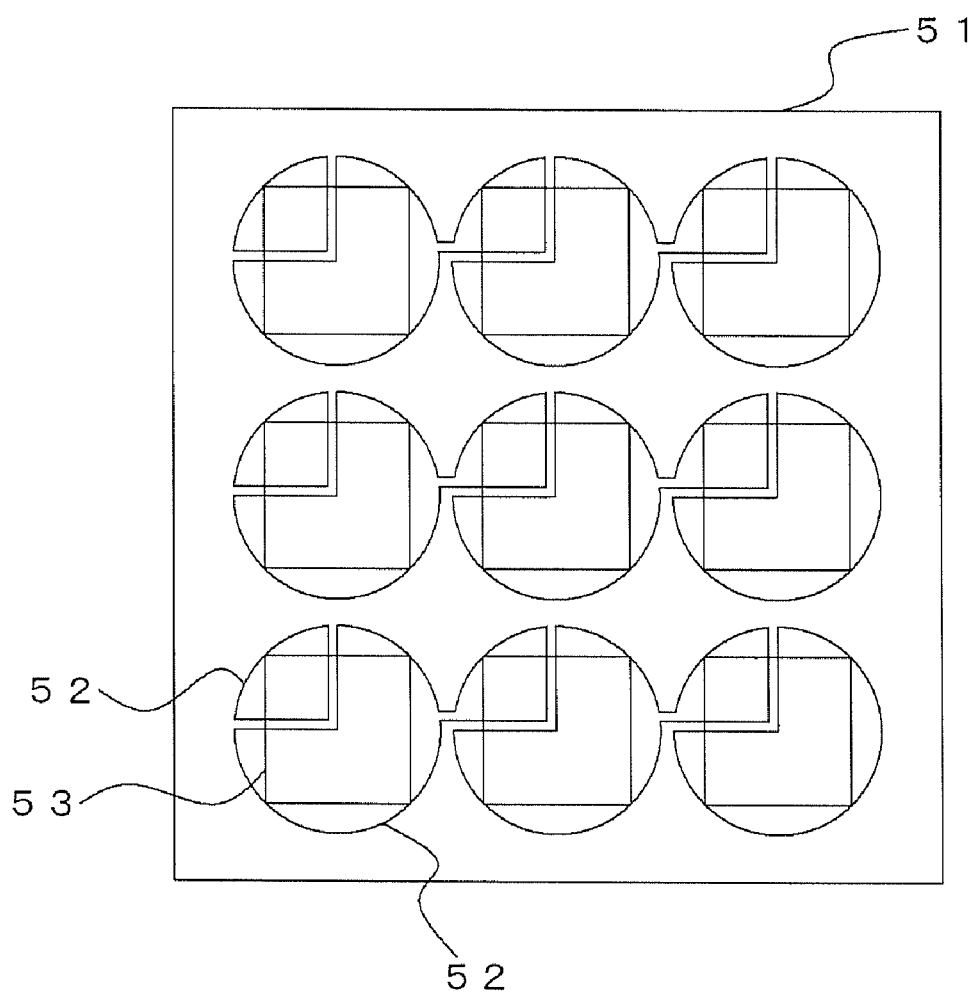
FIG. 20 is a schematic plan view showing the outer appearance of an upper surface of a light emission device of the background art.

As comparative example 3, as shown in FIG. 19, light emission device is manufactured similar to example 3 except that the semiconductor light emitting element is arranged such that the second side 412 faces each other. The light flux of the light emission devices of example 3 is higher than the light flux of the light emission devices of comparative example 3.

In the light emission device according to the embodiments of the present invention, the light exited from the end face of each element can be efficiently reflected at the opposing end faces of a plurality of semiconductor light emitting elements, and the light retrieving efficiency of the light emission device can be enhanced.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A light emission device comprising:
   a plurality of semiconductor light emitting elements each having a substantially rectangular shape which has a first side, a second side, and an other side, wherein the second side and the other side are different from and adjacent to the first side, wherein the other side is opposite to the second side, light emitted from a first element end face on the first side being stronger than light emitted from a second element end face on the second side, each of the plurality of semiconductor light emitting elements comprising:
   a transparent substrate;
   a first semiconductor layer of a first conductive type provided on the transparent substrate;
   a second semiconductor layer of a second conductive type provided on the first semiconductor layer;
   a first electrode provided on an exposure part of the first semiconductor layer; and
   a second electrode provided on the second semiconductor layer; and
   a supporting substrate on which the plurality of semiconductor light emitting elements are flip-chip mounted,
   wherein each first side of each of the plurality of semiconductor light emitting elements faces each other substantially in parallel,
   wherein the second side and the other side do not face an adjacent semiconductor light emitting element,
   wherein the first electrode is an n electrode and the second electrode is a p electrode,
   wherein, when viewed from the first side, each of the plurality of semiconductor light emitting elements includes a cross-section parallel to the first side that consecutively alternates between the p electrode and the n electrode a plurality of times such that both ends of the first side are a p electrode,
   wherein a ratio $R_1/L_1$ of $R_1$ to $L_1$ is smaller than a ratio $R_2/L_2$ of $R_2$ to $L_2$,
   wherein $R_1$ is an area of a first region on the second electrode, the first region being defined by a group of first hypothetical lines extending on the second electrode perpendicularly to the first side from endpoints located at the first side or at locations closest to the first side to endpoints located at either one of a third side of each of the plurality of semiconductor light emitting elements opposite to the first side or a first exposure side of the exposure part of the first semiconductor layer whichever the first hypothetical lines on the second electrode first reach,
   wherein $L_1$ is a length of the first side,
   wherein $R_2$ is an area of a second region on the second electrode, the second region being defined by a group of second hypothetical lines extending on the second electrode perpendicularly to the second side from endpoints located at the second side or at locations closest to the second side to endpoints located at either one of the other side defined as a fourth side of each of the plurality of semiconductor light emitting elements opposite to the second side or a second exposure side of the exposure part of the first semiconductor layer whichever the second hypothetical lines on the second electrode first reach, and
   wherein $L_2$ is a length of the second side.

2. The light emission device according to claim 1,
   wherein a ratio $R_{1'}/L_{1'}$ of $R_{1'}$ to $L_{1'}$ is substantially equal to the ratio $R_1/L_1$,
   wherein $R_{1'}$ is an area of a third region on the second electrode, the third region being defined by a group of third hypothetical lines extending on the second electrode perpendicularly to the third side from endpoints located at the third side or at locations closest to the third side to endpoints located at either one of the first side or a third exposure side of the exposure part of the first semiconductor layer whichever the third hypothetical lines on the second electrode first reach, and
   wherein $L_{1'}$ is a length of the third side.

3. The light emission device according to claim 1, wherein the second semiconductor layer comprises GaN.

4. A light emission device comprising:
a plurality of semiconductor light emitting elements each having a substantially rectangular shape which has a first side, a second side, and an other side, wherein the second side and the other side are different from and adjacent to the first side, wherein the other side is opposite to the second side, light emitted from a first element end face on the first side being stronger than light emitted from a second element end face on the second side, each of the plurality of semiconductor light emitting elements comprising:
a transparent substrate;
a first semiconductor layer of a first conductive type provided on the transparent substrate;
a second semiconductor layer of a second conductive type provided on the first semiconductor layer;
a first electrode provided on an exposure part of the first semiconductor layer; and
a second electrode provided on the second semiconductor layer; and
a supporting substrate on which the plurality of semiconductor light emitting elements are flip-chip mounted,
wherein each first side of each of the plurality of semiconductor light emitting elements faces each other substantially in parallel,
wherein the second side and the other side do not face an adjacent semiconductor light emitting element,
wherein the first electrode is an n electrode and the second electrode is a p electrode,
wherein, when viewed from the first side, each of the plurality of semiconductor light emitting elements includes a cross-section parallel to the first side that consecutively alternates between the p electrode and the n electrode a plurality of times such that both ends of the first side are a p electrode,
wherein the second electrode of each of the semiconductor light emitting elements includes a first narrow region and a first extending part, the first narrow region being sandwiched between the first side and a first portion of the exposure part closest to the first side, the first extending part extending beyond the first narrow region, a length of the first narrow region along the first side being longer than a length of the first extending part along the first side,
wherein the second electrode includes a second narrow region and a second extending part, the second narrow region being sandwiched between the second side and a second portion of the exposure part closest to the second side, the second extending part extending beyond the second narrow region, and
wherein a ratio $A_1/L_1$ of a length $A_1$ of the first narrow region along the first side to a length $L_1$ of the first side is greater than a ratio $A_2/L_2$ of a length $A_2$ of the second narrow region along the second side to a length $L_2$ of the second side.

5. The light emission device according to claim 4, wherein a length of the second narrow region along the second side is shorter than a length of the second extending part along the second side.

6. A light emission device comprising:
a plurality of semiconductor light emitting elements each having a substantially rectangular shape which has a first side, a second side, and an other side, wherein the second side and the other side are different from and adjacent to the first side, wherein the other side is opposite to the second side, each of the plurality of semiconductor light emitting elements comprising:
a transparent substrate;
a first semiconductor layer of a first conductive type provided on the transparent substrate;
a second semiconductor layer of a second conductive type provided on the first semiconductor layer;
a first electrode provided on an exposure part of the first semiconductor layer; and
a second electrode provided on the second semiconductor layer; and
a supporting substrate on which the plurality of semiconductor light emitting elements are flip-chip mounted,
wherein each first side of each of the plurality of semiconductor light emitting elements faces each other substantially in parallel,
wherein the second side and the other side do not face an adjacent semiconductor light emitting element,
wherein a ratio $R_1/L_1$ of $R_1$ to $L_1$ is smaller than a ratio $R_2/L_2$ of $R_2$ to $L_2$,
wherein $R_1$ is an area of a first region on the second electrode, the first region being defined by a group of first hypothetical lines extending on the second electrode perpendicularly to the first side from endpoints located at the first side or at locations closest to the first side to endpoints located at either one of a third side of each of the plurality of semiconductor light emitting elements opposite to the first side or a first exposure side of the exposure part of the first semiconductor layer whichever the first hypothetical lines on the second electrode first reach,
wherein $L_1$ is a length of the first side,
wherein $R_2$ is an area of a second region on the second electrode, the second region being defined by a group of second hypothetical lines extending on the second electrode perpendicularly to the second side from endpoints located at the second side or at locations closest to the second side to endpoints located at either one of the other side defined as a fourth side of each of the plurality of semiconductor light emitting elements opposite to the second side or a second exposure side of the exposure part of the first semiconductor layer whichever the second hypothetical lines on the second electrode first reach,
wherein $L_2$ is a length of the second side,
wherein the first electrode is an n electrode and the second electrode is a p electrode, and
wherein, when viewed from the first side, each of the plurality of semiconductor light emitting elements includes a cross-section parallel to the first side that consecutively alternates between the p electrode and the n electrode a plurality of times such that both ends of the first side are a p electrode.

7. The light emission device according to claim 6, wherein the second electrode of each of the semiconductor light emitting elements includes a first narrow region and a first extending part, the first narrow region being sandwiched between the first side and a first portion of the exposure part closest to the first side, the first extending part extending beyond the first narrow region, a length of the first narrow region along the first side being longer than a length of the first extending part along the first side.

8. The light emission device according to claim 6,
wherein a ratio $S_1/L_1$ of an area $S_1$ to a length $L_1$ of the first side is smaller than or substantially equal to a ratio $S_2/L_2$ of an area $S_2$ to a length $L_2$ of the second side, and
wherein $S_1$ is an area of a fifth region on the exposure part of the first semiconductor layer, the fifth region being defined by a group of fifth hypothetical lines extending on the exposure part perpendicularly to the first side from endpoints located at the first side or at locations closest to the first side to endpoints located at either one of a third side of each of the plurality of semiconductor light emitting elements opposite to the first side or the second semiconductor layer whichever the fifth hypothetical lines on the exposure part first reach, wherein $L_1$ is a length of the first side, wherein $S_2$ is an area of a sixth region on the exposure part of the first semiconductor layer, the sixth region being defined by a group of sixth hypothetical lines extending on the exposure part perpendicularly to the second side from endpoints located at the second side or at locations closest to the second side to endpoints located at either one of the other side defined as a fourth side of each of the plurality of semiconductor light emitting elements opposite to the second side or the second semiconductor layer whichever the sixth hypothetical lines on the exposure part first reach, and wherein $L_2$ is a length of the second side.

9. The light emission device according to claim 6, wherein the second semiconductor layer comprises GaN.

10. A light emission device comprising:
a plurality of semiconductor light emitting elements each having a substantially rectangular shape which has a first side and a second side different from the first side, light emitted from a first element end face on the first side being stronger than light emitted from a second element end face on the second side, each of the plurality of semiconductor light emitting elements comprising:
a transparent substrate;
an n-type semiconductor layer provided on the transparent substrate;
a p-type semiconductor layer provided on the n-type semiconductor layer;
a p electrode provided on the p-type semiconductor layer; and
n electrodes provided in a plurality of openings that extend through the p electrode; and
a supporting substrate on which the plurality of semiconductor light emitting elements are flip-chip mounted, each first side of each of the plurality of semiconductor light emitting elements facing each other substantially in parallel,
wherein a first ratio equals a first length defined as a total length of the n electrodes, when viewed from the first side, divided by a total length of the first side;
wherein a second ratio equals a second length defined as a total length of the n electrodes, when viewed from the second side, divided by a total length of the second side; and
wherein the first ratio is larger than the second ratio.

11. The light emission device according to claim 10, wherein, when viewed from the first side, each of the plurality of semiconductor light emitting elements includes a cross-section parallel to the first side that consecutively alternates between the p electrode and the n electrode a plurality of times such that both ends of the first side are a p electrode.

12. The light emission device according to claim 10, wherein, when viewed from the second side, each of the plurality of semiconductor light emitting elements includes a cross-section parallel to the second side that consecutively alternates between the p electrode and the n electrode a plurality of times such that both ends of the second side are a p electrode.

13. The light emission device according to claim 10, wherein a total surface area of the p electrode is larger than a total surface area of the n electrodes.

14. The light emission device according to claim 10, wherein the n electrodes are a plurality of separate n electrodes.

15. The light emission device according to claim 10, wherein each of the plurality of semiconductor light emitting elements comprises only one p electrode and a plurality of separate n electrodes.

16. A light emission device comprising:
a plurality of semiconductor light emitting elements each having a substantially rectangular shape which has a first side and a second side different from the first side, light emitted from a first element end face on the first side being stronger than light emitted from a second element end face on the second side, each of the plurality of semiconductor light emitting elements comprising:
a transparent substrate;
an n-type semiconductor layer provided on the transparent substrate;
a p-type semiconductor layer provided on the n-type semiconductor layer;
a p electrode provided on the p-type semiconductor layer; and
n electrodes provided in a plurality of openings that extend through the p electrode; and
a supporting substrate on which the plurality of semiconductor light emitting elements are flip-chip mounted, each first side of each of the plurality of semiconductor light emitting elements facing each other substantially in parallel,
wherein a first length defined as a total length of the n electrodes, when viewed from the first side, is larger than a second length defined as a total length of the p electrode provided in spaces between the plurality of openings through which the n electrodes extend and in spaces between outermost openings of the plurality of openings and respective edges of the p-type semiconductor layer, when viewed from the first side.

17. The light emission device according to claim 16, wherein, when viewed from the first side, each of the plurality of semiconductor light emitting elements includes a cross-section parallel to the first side that consecutively alternates between the p electrode and the n electrode a plurality of times such that both ends of the first side are a p electrode.

18. The light emission device according to claim 16, wherein, when viewed from the second side, each of the plurality of semiconductor light emitting elements includes a cross-section parallel to the second side that consecutively alternates between the p electrode and the n electrode a plurality of times such that both ends of the second side are a p electrode.

19. The light emission device according to claim 16, wherein a total surface area of the p electrode is larger than a total surface area of the n electrodes.

20. The light emission device according to claim 16, wherein the n electrodes are a plurality of separate n electrodes.

21. The light emission device according to claim 16, wherein each of the plurality of semiconductor light emitting elements comprises only one p electrode and a plurality of separate n electrodes.

22. A light emission device comprising:
a plurality of semiconductor light emitting elements each having a substantially rectangular shape which has a first side and a second side different from the first side, light emitted from a first element end face on the first side being stronger than light emitted from a second element end face on the second side, each of the plurality of semiconductor light emitting elements comprising:
- a transparent substrate;
- an n-type semiconductor layer provided on the transparent substrate;
- a p-type semiconductor layer provided on the n-type semiconductor layer;
- a p electrode provided on the p-type semiconductor layer; and
- n electrodes provided in a plurality of openings that extend through the p electrode; and a supporting substrate on which the plurality of semiconductor light emitting elements are flip-chip mounted, each first side of each of the plurality of semiconductor light emitting elements facing each other substantially in parallel, wherein a first length defined as a total length of the n electrodes, when viewed from the second side, is smaller than a second length defined as a total length of the p electrode provided in spaces between the plurality of openings through which the n electrodes extend and in spaces between outermost openings of the plurality of openings and respective edges of the p-type semiconductor layer, when viewed from the second side.

23. The light emission device according to claim 22, wherein, when viewed from the first side, each of the plurality of semiconductor light emitting elements includes a cross-section parallel to the first side that consecutively alternates between the p electrode and the n electrode a plurality of times such that both ends of the first side are a p electrode.

24. The light emission device according to claim 22, wherein, when viewed from the second side, each of the plurality of semiconductor light emitting elements includes a cross-section parallel to the second side that consecutively alternates between the p electrode and the n electrode a plurality of times such that both ends of the second side are a p electrode.

25. The light emission device according to claim 22, wherein a total surface area of the p electrode is larger than a total surface area of the n electrodes.

26. The light emission device according to claim 22, wherein the n electrodes are a plurality of separate n electrodes.

27. The light emission device according to claim 22, wherein each of the plurality of semiconductor light emitting elements comprises only one p electrode and a plurality of separate n electrodes.

* * * * *